(12) United States Patent
Kuwashima et al.

(10) Patent No.: US 7,364,954 B2
(45) Date of Patent: Apr. 29, 2008

(54) METHOD FOR MANUFACTURING SEMICONDUCTOR DEVICE

(75) Inventors: Kazutaka Kuwashima, Atsugi (JP); Tamae Takano, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 96 days.

(21) Appl. No.: 11/410,082

(22) Filed: Apr. 25, 2006

(65) Prior Publication Data

US 2006/0246640 A1 Nov. 2, 2006

(30) Foreign Application Priority Data

Apr. 28, 2005 (JP) ............... 2005-133672

(51) Int. Cl.
*H01L 21/84* (2006.01)

(52) U.S. Cl. ............... 438/151; 438/459; 257/E21.561

(58) Field of Classification Search ........ 438/151–166, 438/455–459; 257/E21.561
See application file for complete search history.

(56) References Cited

U.S. PATENT DOCUMENTS

| | | | |
|---|---|---|---|
| 4,727,044 A * | 2/1988 | Yamazaki ............ | 438/166 |
| 5,757,456 A | 5/1998 | Yamazaki et al. | |
| 6,127,199 A | 10/2000 | Inoue et al. | |
| 6,975,018 B2 | 12/2005 | Ohmi et al. | |
| 2004/0217431 A1 | 11/2004 | Shimada | |
| 2006/0055314 A1 | 3/2006 | Nakamura et al. | |
| 2006/0121694 A1 | 6/2006 | Tamura | |
| 2006/0244063 A1 | 11/2006 | Isobe et al. | |
| 2006/0246633 A1 | 11/2006 | Arai et al. | |
| 2006/0246644 A1 | 11/2006 | Isobe et al. | |
| 2006/0246738 A1 | 11/2006 | Isobe et al. | |
| 2006/0270066 A1 | 11/2006 | Imahayashi et al. | |

FOREIGN PATENT DOCUMENTS

| | | |
|---|---|---|
| JP | 08-254686 | 10/1996 |
| JP | 10-125929 | 5/1998 |
| JP | 2002-261091 | 9/2002 |
| JP | 2004-319952 | 11/2004 |
| JP | 2005-093737 | 4/2005 |

OTHER PUBLICATIONS

*The Advancing Introduction of Plasma Oxynitriding Apparatus Adopted by More Than 10 LSI Makers*, Nikkei Microdevices, Apr. 2005, pp. 100-103.

* cited by examiner

*Primary Examiner*—Richard A. Booth
(74) *Attorney, Agent, or Firm*—Eric J. Robinson; Robinson Intellectual Property Law Office, P.C.

(57) ABSTRACT

The present invention provides a manufacturing method of a semiconductor device at low cost and with high reliability. According to one feature of a method for manufacturing a semiconductor device includes the steps of forming a metal film over a substrate; forming a metal oxide film over the surface of the metal film by performing plasma treatment to the metal film in an atmosphere containing oxygen; forming a base film over the metal oxide film; forming an element layer having a thin film transistor over the base film; forming a protective layer over the element layer; forming an opening after selectively removing the metal film, the metal oxide film, the base film, the element layer, and the protective layer; separating the base film, the element layer, and the protective layer from the substrate; and sealing the base film, the element layer, and the protective layer by using flexible first and second films, in which an electron density of plasma around the substrate is $1\times10^{11}$ $cm^{-3}$ or more and $1\times10^{13}$ $cm^{-3}$ or less and an electron temperature of the plasma treatment is 0.5 eV or more and 1.5 eV or less.

22 Claims, 21 Drawing Sheets

17

18

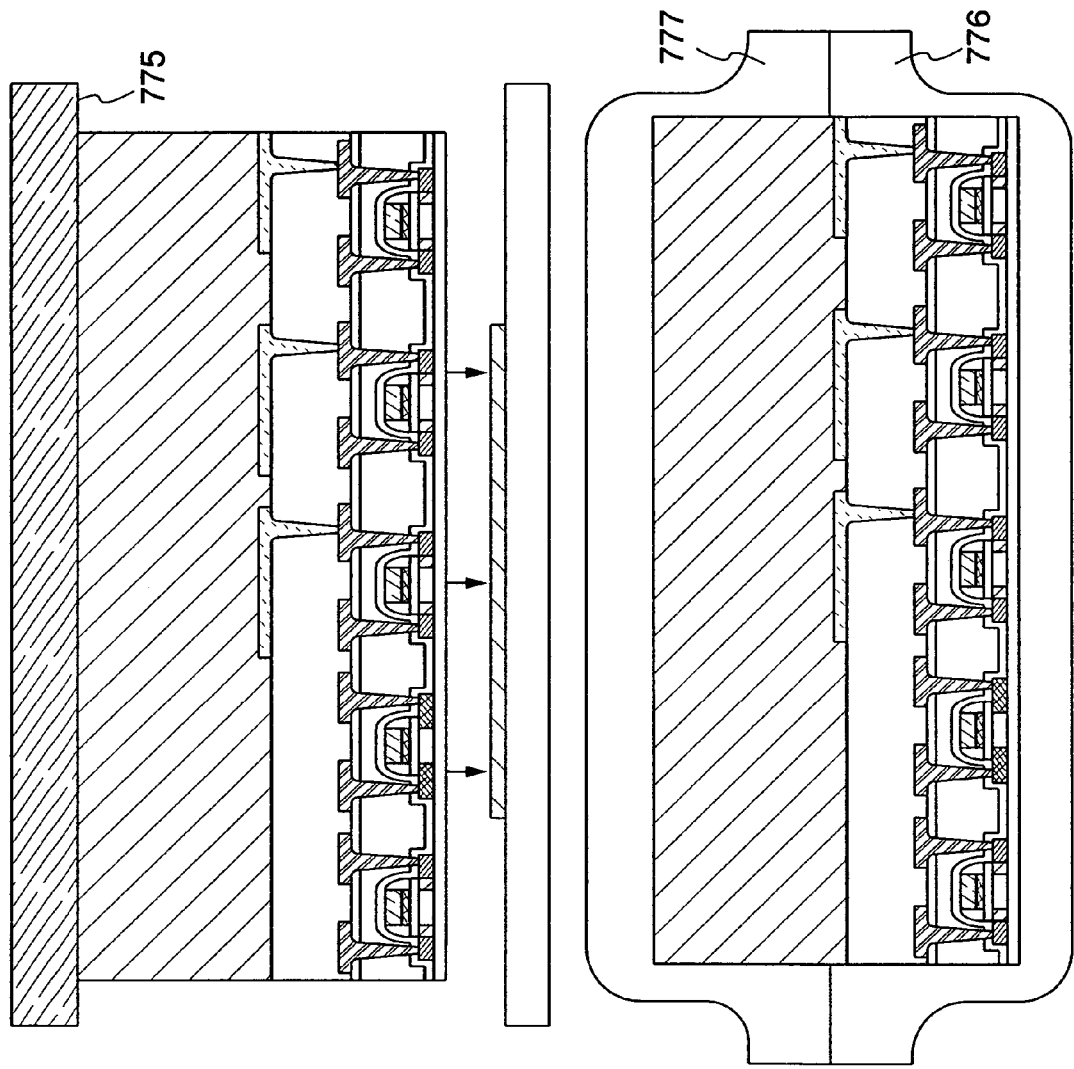

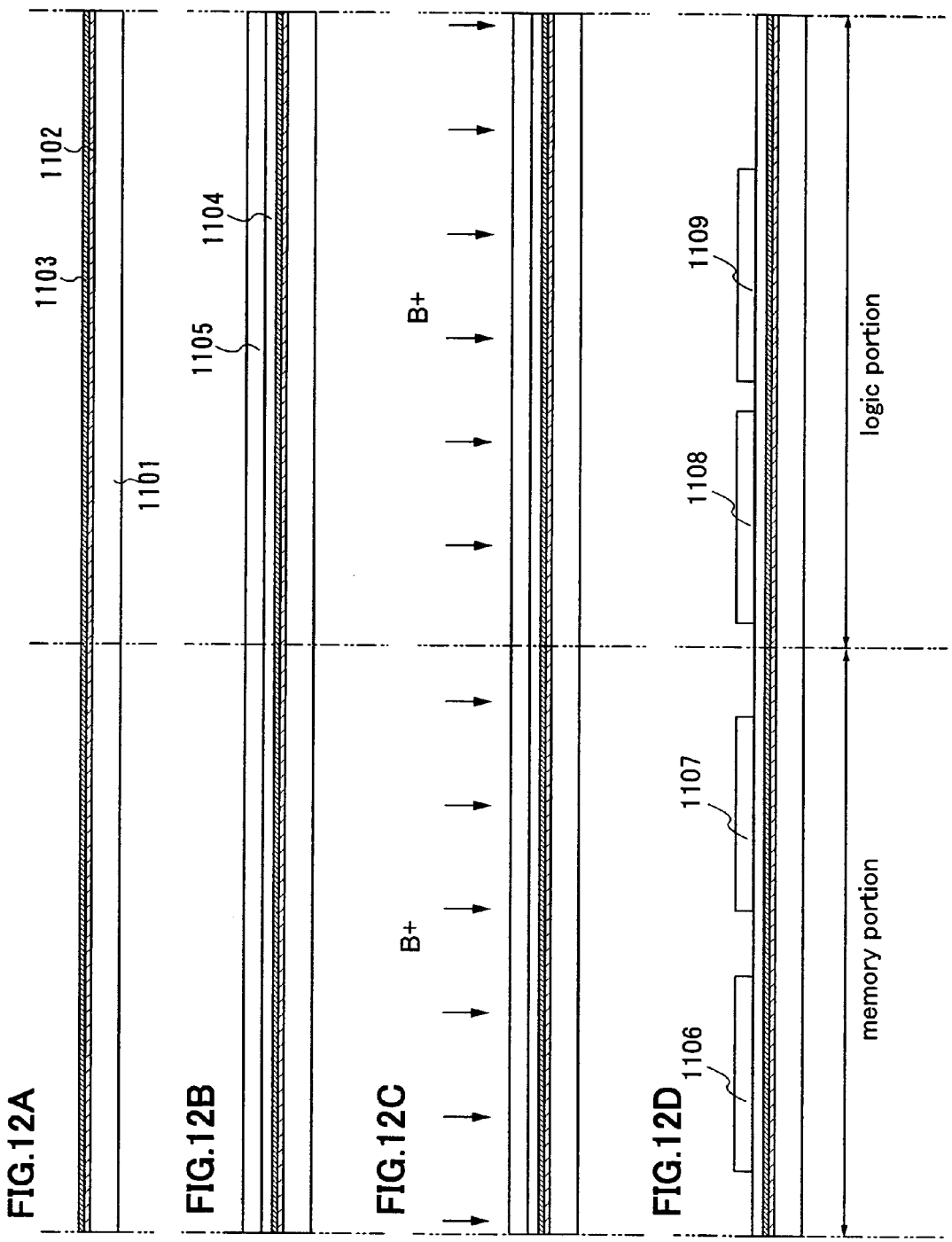

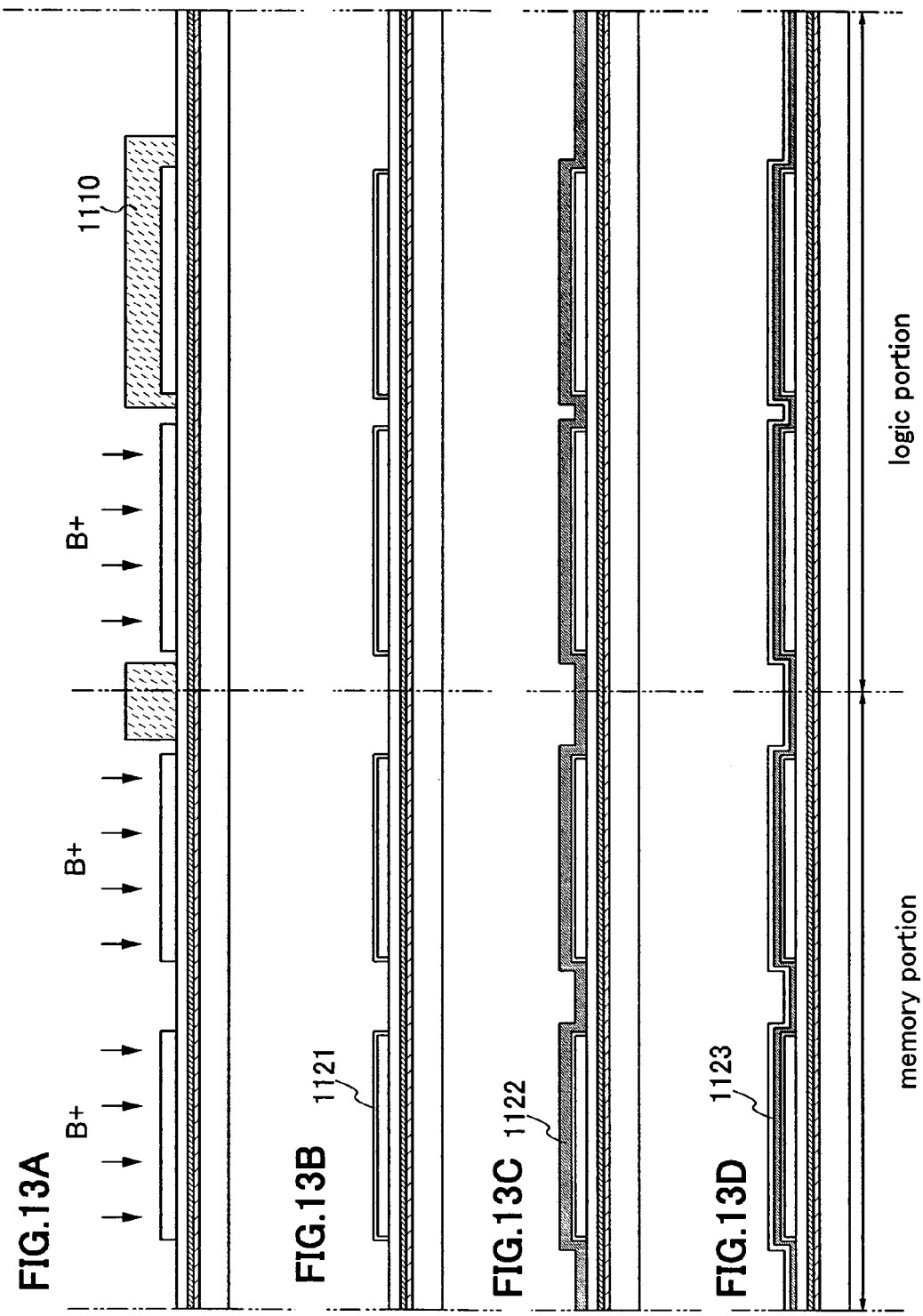

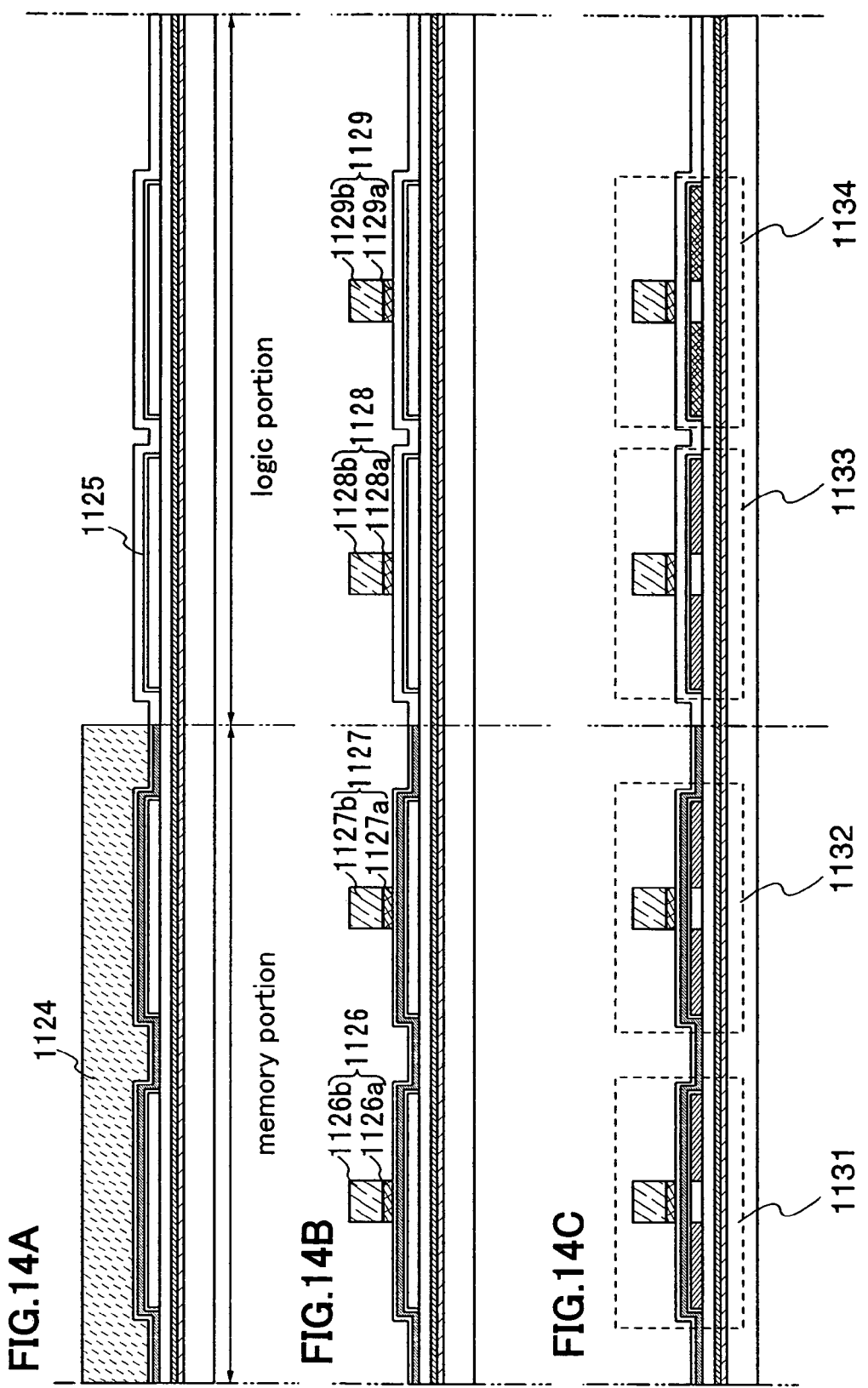

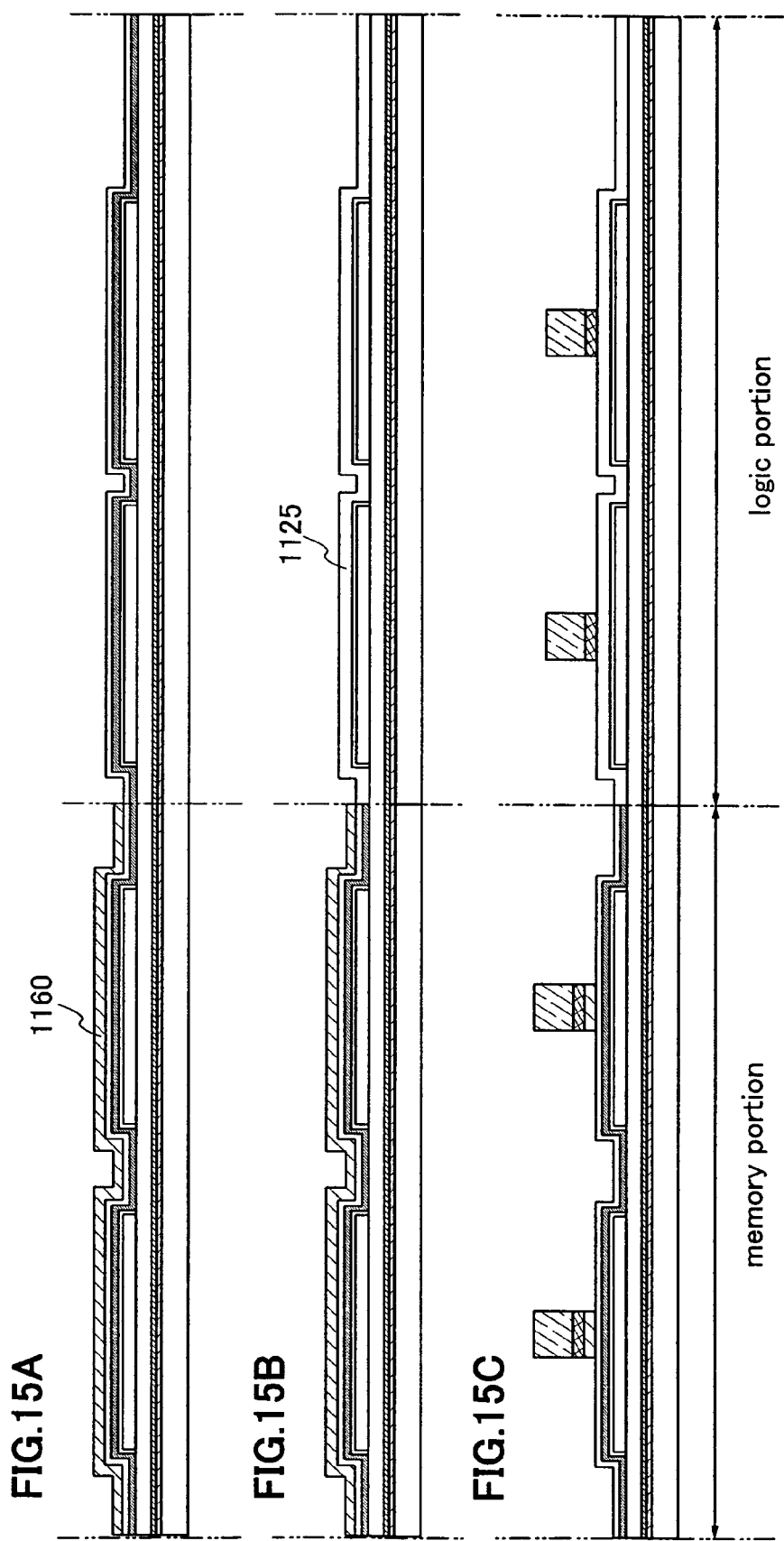

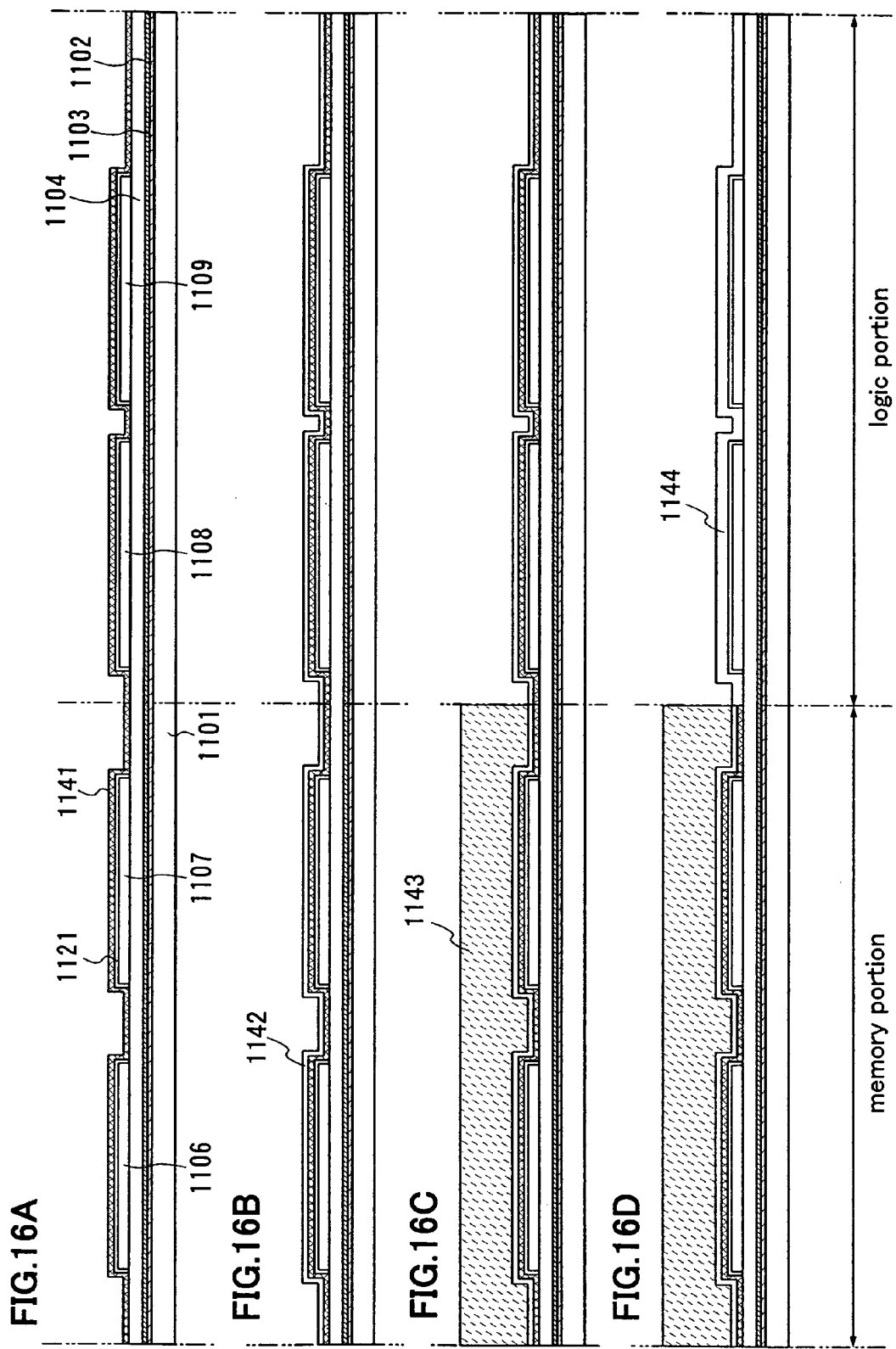

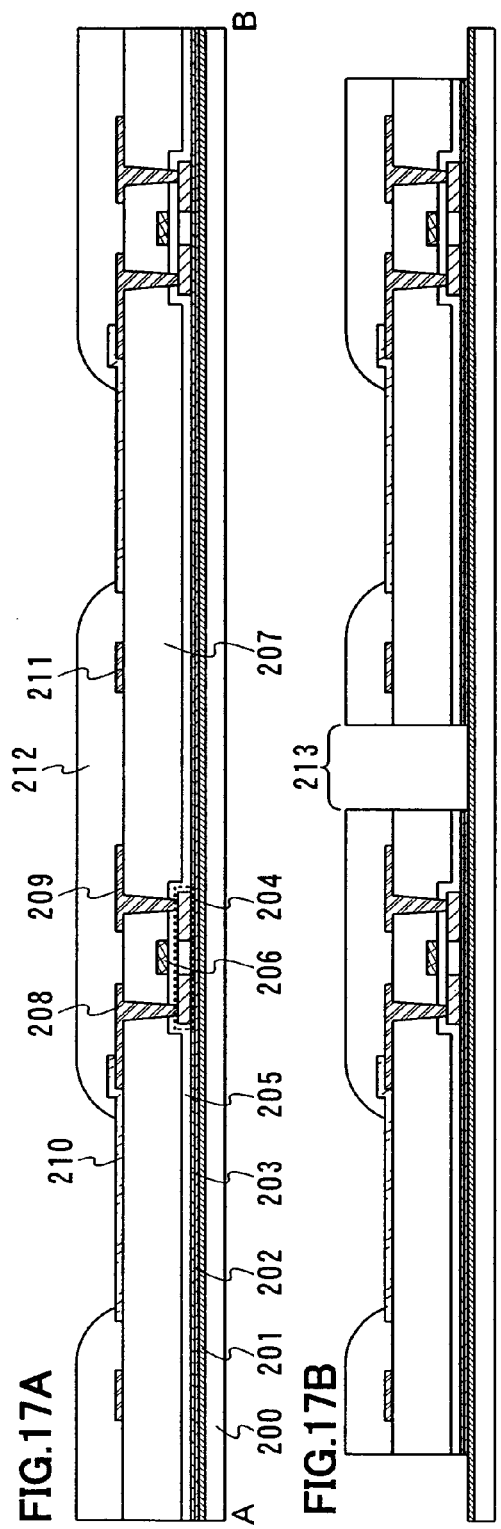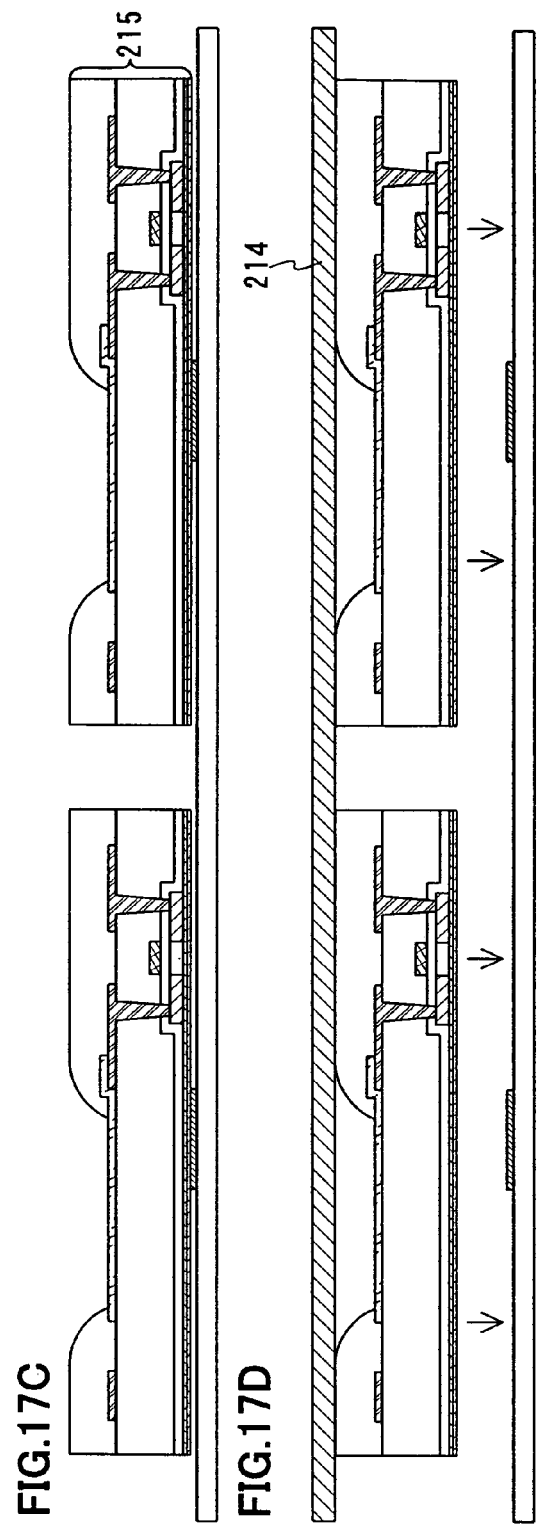

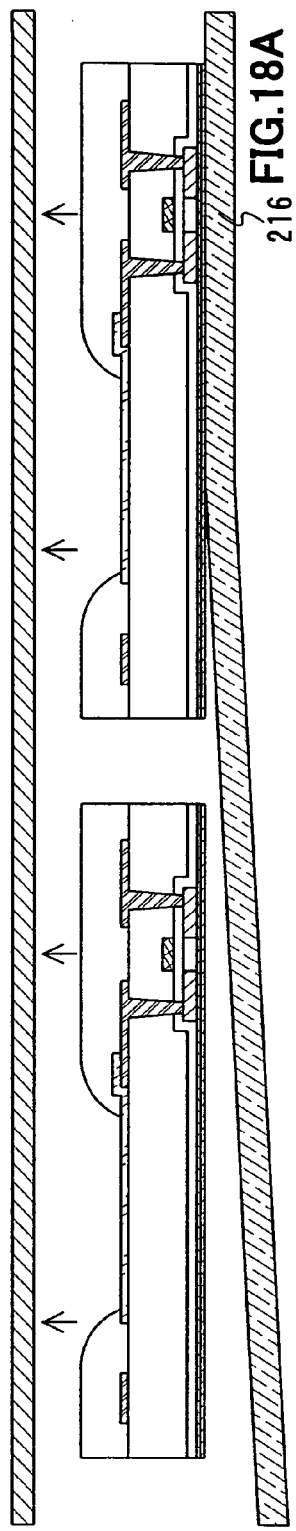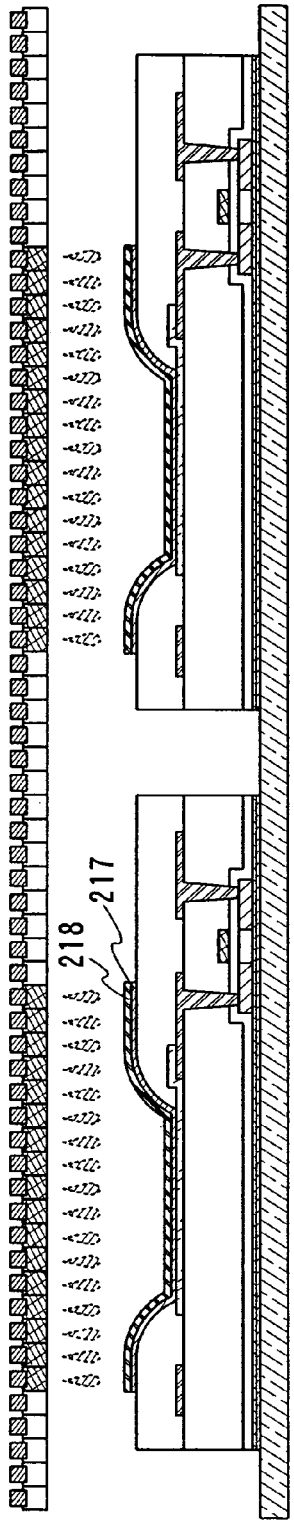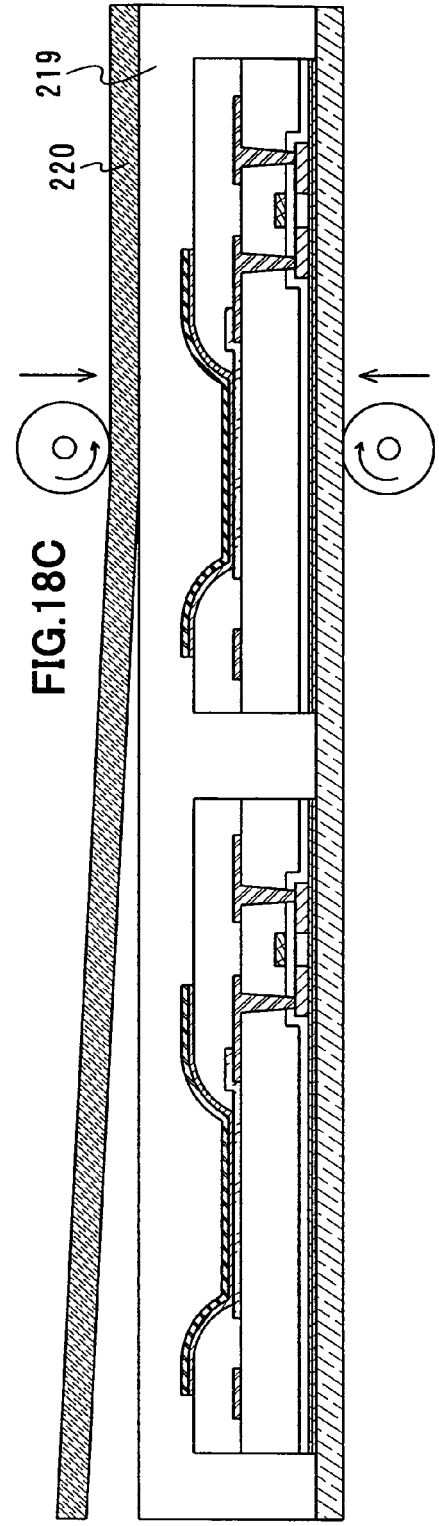

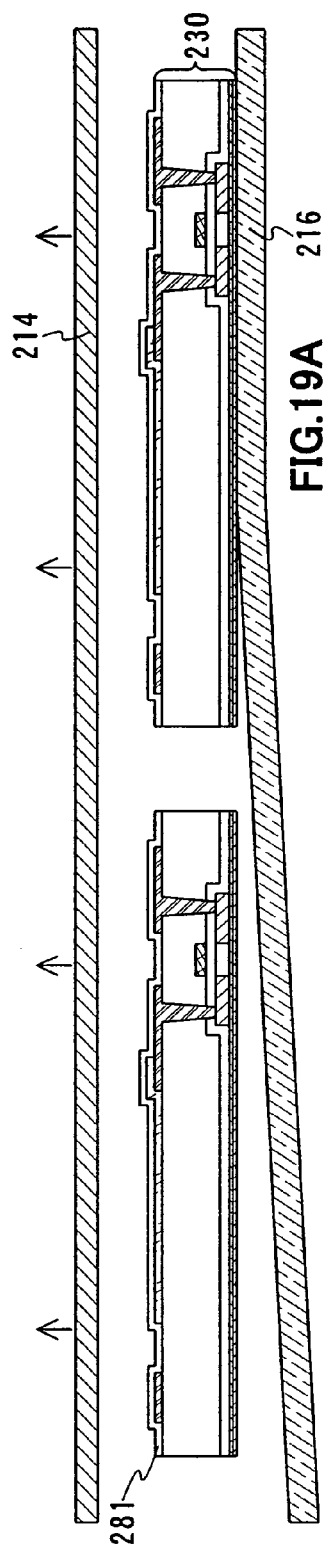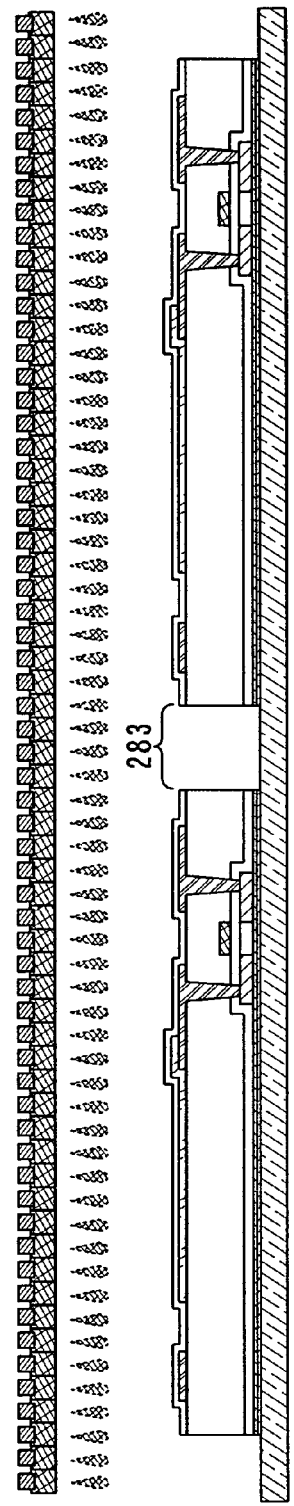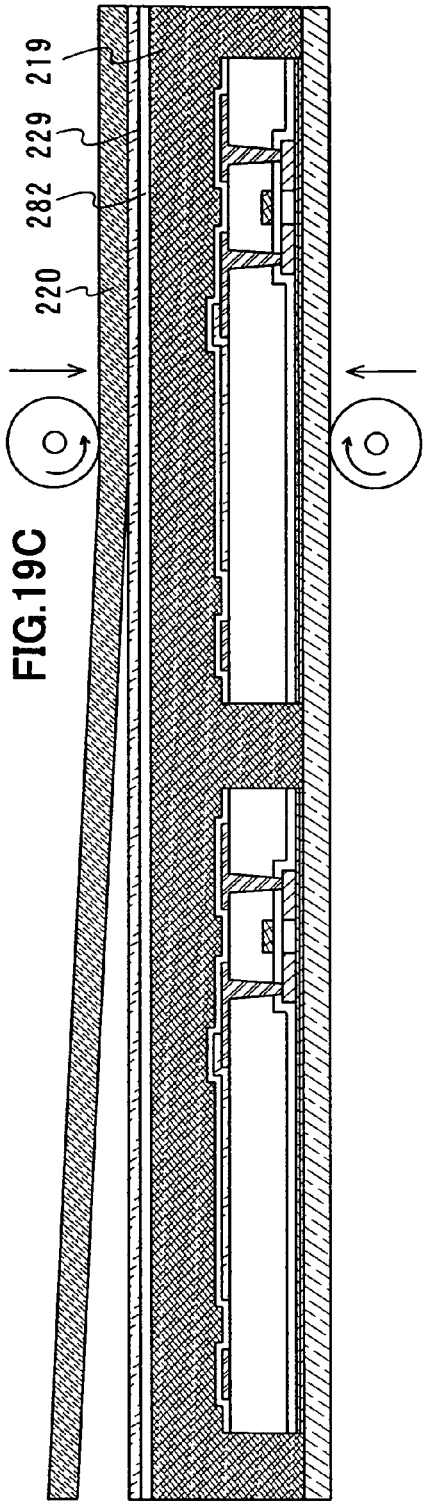

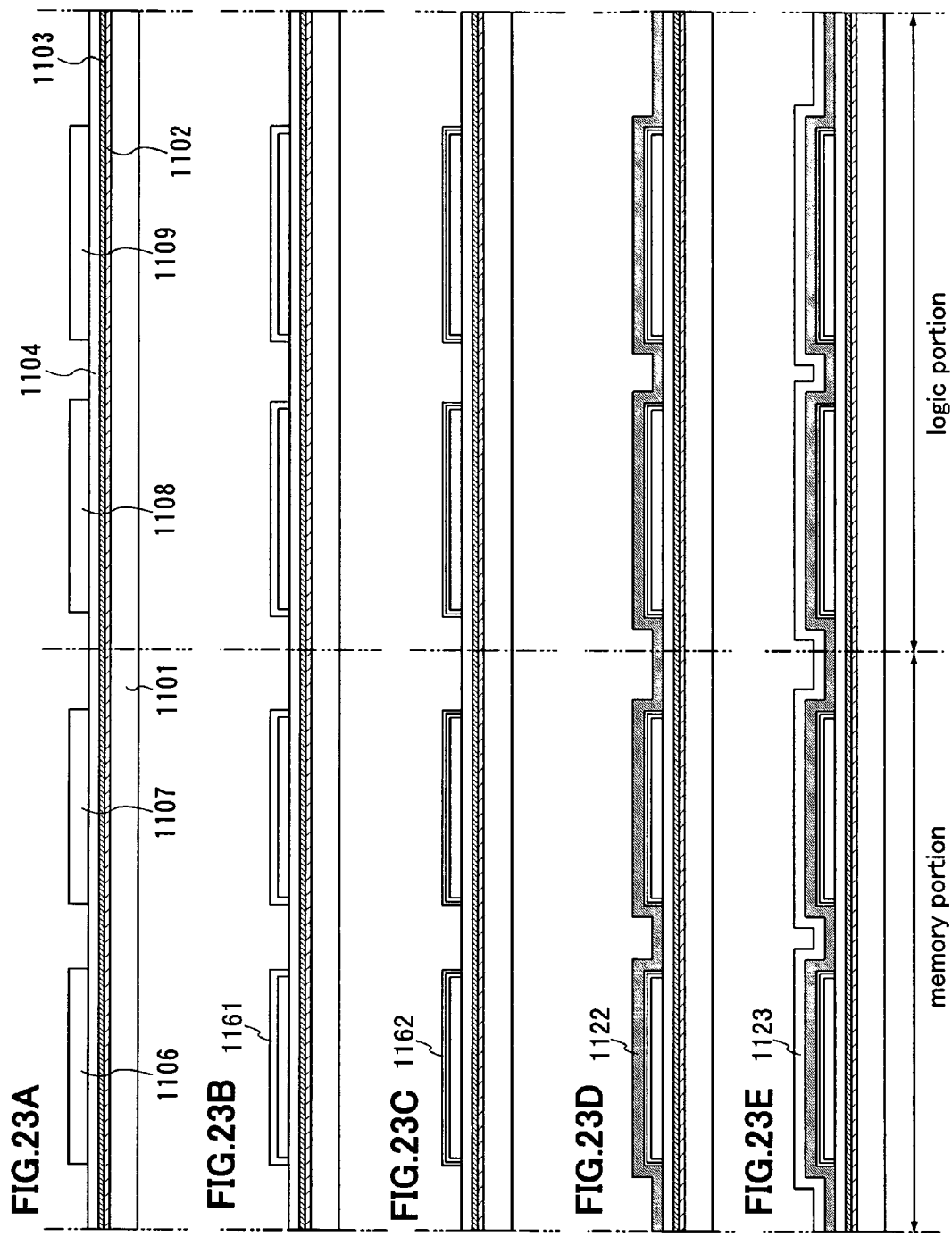

METHOD FOR MANUFACTURING SEMICONDUCTOR DEVICE

BACKGROUND OF THE INVENTION

1. Field of the Invention

The present invention disclosed in this specification relates to a method for manufacturing a semiconductor device. In particular, the present invention relates to a method for manufacturing a semiconductor device in which an element layer is peeled off a supporting substrate by using a peeling layer provided between the supporting substrate and the element layer.

2. Description of the Related Art

In recent years, development of a wireless chip that transmits and receives data has been actively advanced. The wireless chip is also referred to as an IC tag, an ID tag, an RF (Radio Frequency) tag, an RFID (Radio Frequency Identification) tag, a wireless tag, an electronic tag, a wireless processor, a wireless memory, and the like. In this specification, the wireless chip may also be referred to as a semiconductor device.

In general, an RFID tag is constituted by an antenna and an IC chip, which is formed by an element layer including a transistor or the like provided over a silicon wafer. In recent years, however, technological development of an RFID tag using an element layer provided over a glass substrate or the like has been advanced for cost reduction. However, in the case of using a technique for providing an element layer over a glass substrate, after forming an element layer over a glass substrate, the element layer is required to be separated from the glass substrate, which is a supporting substrate, and to displace the element layer over a flexible substrate. The wireless chip is used by attaching to a surface of an article, embedding in an article, or the like so as to be fixed. This is because it is desirable that the wireless chip itself has flexibility in a case of attaching or fixing the wireless chip to an article having curvature or flexibility.

Various techniques are known as a method for peeling an element layer provided over a supporting substrate. For example, there are a method for taking out an element layer by making a supporting substrate thin by grinding or polishing, a method for removing a supporting substrate by chemical reaction or the like, a method for peeling an element layer provided over a supporting substrate, and the like. As a method for peeling an element layer provided over a supporting substrate, there is a method that a separating layer is provided between a substrate and a layer to be transferred, and separation is made to occur in the separating layer by laser light irradiation through the substrate (see Reference 1: Japanese Patent Application Laid-Open No. H10-125929). In addition, there is a method to separate an element layer from a supporting substrate by providing a peeling layer containing silicon between the element layer and the supporting substrate and removing the peeling layer with the use of gas containing halogen fluoride (chemical formula: $XF_n$ (X is halogen other than fluorine and n is an integer number) (see Reference 2: Japanese Patent Application Laid-Open No. H8-254686).

However, the above conventional methods, that is, the methods for removing a supporting substrate by grinding, polishing, or dissolving has caused problems such as damage due to physical strength such as stress, and contamination. In addition, according to such methods, it has been extremely difficult to reuse a substrate and the cost has been increased.

In the case where an element layer provided over a supporting substrate is separated by removing a peeling layer provided between the supporting substrate and the element layer, the quality of the peeling layer becomes important. Time required for removing the peeling layer is affected depending on a material used for the peeling layer and an etchant used for removing the peeling layer. In addition, in a case where an element layer constituted by a thin film transistor or the like is provided over a peeling layer, the property of the transistor may be affected and the reliability of a semiconductor device may be decreased depending on a material or the film quality of the peeling layer.

SUMMARY OF THE INVENTION

In view of the above problem, the present invention provides a manufacturing method of a semiconductor device at low cost and with high reliability.

According to one feature of the present invention, a method for manufacturing a semiconductor device includes the steps of forming a metal film over a substrate; forming a metal oxide film over the surface of the metal film by performing plasma treatment to the metal film in an atmosphere containing oxygen; forming a base film over the metal oxide film; forming an element layer having a thin film transistor over the base film; forming a protective layer over the element layer; forming an opening after selectively removing the metal film, the metal oxide film, the base film, the element layer, and the protective layer; separating the base film, the element layer, and the protective layer from the substrate; and sealing the base film, the element layer, and the protective layer by using flexible first and second films, in which an electron density of plasma is $1\times10^{11}$ cm$^{-3}$ or more and $1\times10^{13}$ cm$^{-3}$ or less and an electron temperature of the plasma treatment is 0.5 eV or more and 1.5 eV or less around the substrate.

According to another feature of the present invention, a method for manufacturing a semiconductor device includes the steps of forming a metal oxide film over a substrate by using plasma in an atmosphere containing oxygen; forming a base film over the metal oxide film; forming an element layer having a thin film transistor over the base film; forming a protective layer over the element layer; forming an opening after selectively removing the metal oxide film, the base film, the element layer, and the protective layer; separating the base film, the element layer, and the protective layer from the substrate; and sealing the base film, the element layer, and the protective layer by using flexible first and second films, in which an electron density of the plasma is $1\times10^{11}$ cm$^{-3}$ or more and $1\times10^{13}$ cm$^{-3}$ or less and an electron temperature of the plasma is 0.5 eV or more and 1.5 eV or less around the substrate.

According to another feature of the present invention, a method for manufacturing a semiconductor device includes the steps of forming an insulating film over a substrate; forming a metal film over the insulating film; forming a metal oxide film over the surface of the metal film by performing plasma treatment to the metal film in an atmosphere containing oxygen; forming a silicon oxide film over the metal oxide film; nitriding the surface of the silicon oxide film by performing plasma treatment to the silicon oxide film in an atmosphere containing nitrogen; forming a silicon oxide film containing nitrogen over the silicon oxide film the surface of which is nitrided; forming an element layer having a thin film transistor over the silicon oxide film containing nitrogen; forming a protective layer over the element layer; forming an opening after selectively removing the insulating film, the metal film, the metal oxide film, the silicon oxide film the surface of which is nitrided, the silicon oxide film containing nitrogen, the element layer, and the protective layer; separating the silicon oxide film the surface of which is nitrided, the silicon oxide film containing nitrogen, the element layer, and the protective layer from the substrate; and sealing the silicon oxide film the surface of which is nitrided, the silicon oxide film containing nitrogen, the element layer, and the protective layer by using flexible first and second films, in which an electron density of plasma is $1\times10^{11}$ cm$^{-3}$ or more and $1\times10^{13}$ cm$^{-3}$ or less and an electron temperature of at least one of the plasma treatments is 0.5 eV or more and 1.5 eV or less around the substrate.

According to another feature of the present invention, a method for manufacturing a semiconductor device includes the steps of forming an insulating film over a substrate; forming a metal oxide film over the insulating film by using plasma in an atmosphere containing oxygen; forming a silicon oxide film over the metal oxide film; nitriding the surface of the silicon oxide film by performing plasma treatment to the silicon oxide film in an atmosphere containing nitrogen; forming a silicon oxide film containing nitrogen over the silicon oxide film the surface of which is nitrided; forming an element layer having a thin film transistor over the silicon oxide film containing nitrogen; forming a protective layer over the element layer; forming an opening after selectively removing the insulating film, the metal oxide film, the silicon oxide film the surface of which is nitrided, the silicon oxide film containing nitrogen, the element layer, and the protective layer; separating the silicon oxide film the surface of which is nitrided, the silicon oxide film containing nitrogen, the element layer, and the protective layer from the substrate; and sealing the silicon oxide film the surface of which is nitrided, the silicon oxide film containing nitrogen, the element layer, and the protective layer by using flexible first and second films, in which an electron density of the plasma or the plasma treatment is $1\times10^{11}$ cm$^{-3}$ or more and $1\times10^{13}$ cm$^{-3}$ or less and an electron temperature of the plasma is 0.5 eV or more and 1.5 eV or less around the substrate.

According to another feature of a method for manufacturing a semiconductor device in the above structures, the atmosphere containing nitrogen is a mixed gas of $N_2$ or $NH_3$ and a rare gas, or a mixed gas of $N_2$ or $NH_3$, a rare gas, and $H_2$.

According to another feature of a method for manufacturing a semiconductor device in the above structures, the atmosphere containing oxygen is a mixed gas of $O_2$ or $N_2O$ and a rare gas, or a mixed gas of $O_2$ or $N_2O$, a rare gas, and $H_2$.

According to another feature of a method for manufacturing a semiconductor device in the above structures, a frequency of a power source for generating the plasma is 2.45 GHz.

According to another feature of a method for manufacturing a semiconductor device in the above structures, potential of the plasma is 5V or less.

In this specification, an element layer means a layer at least provided with an element typified by a thin film transistor (TFT). Various integrated circuits such as a CPU (central processing unit), a memory, or a microprocessor can be provided by using the element such as a thin film transistor. In addition, the element layer can also have a mode including an antenna as well as a thin film transistor. For example, the element layer composed of a thin film transistor performs an operation by using an AC voltage generated at an antenna and transmission to a reader/writer can be performed by modulating an AC voltage that is applied to the antenna. Note that the antenna may be formed in the element layer along with the thin film transistor or may be formed separately from the thin film transistor and provided so as to be electrically connected thereto subsequently.

By applying the present invention, a semiconductor device provided over a flexible substrate can be manufactured in high yields. In addition, a semiconductor device can be provided with low cost by using a method for manufacturing a semiconductor device according to the present invention.

These and other objects, features and advantages of the present invention will become more apparent upon reading of the following detailed description along with the accompanied drawings.

BRIEF DESCRIPTION OF THE DRAWINGS

In the accompanying drawings:

FIGS. 10A and 10B are views each showing a method for manufacturing a semiconductor device according to the present invention (Embodiment Mode 4);

FIGS. 12A to 12D are views each showing a method for manufacturing a semiconductor device according to the present invention (Embodiment Mode 5);

FIGS. 13A to 13D are views each showing a method for manufacturing a semiconductor device according to the present invention (Embodiment Mode 5);

FIGS. 14A to 14C are views each showing a method for manufacturing a semiconductor device according to the present invention (Embodiment Mode 5);

FIGS. 15A to 15C are views each showing a method for manufacturing a semiconductor device according to the present invention (Embodiment Mode 5);

FIGS. 16A to 16D are views each showing a method for manufacturing a semiconductor device according to the present invention (Embodiment Mode 6);

FIGS. 17A to 17D are views each showing a method for manufacturing a semiconductor device according to the present invention (Embodiment Mode 9);

FIGS. 18A to 18C are views each showing a method for manufacturing a semiconductor device according to the present invention (Embodiment Mode 9);

FIGS. 19A to 19C are views each showing a method for manufacturing a semiconductor device according to the present invention (Embodiment Mode 9);

FIGS. 23A to 23E are views each explaining a usage pattern of a semiconductor device according to the present invention (Embodiment Mode 7).

DETAILED DESCRIPTION OF THE INVENTION

Embodiment Modes of the present invention will be explained below with reference to the accompanying drawings. However, it is to be easily understood that various changes and modifications will be apparent to those skilled in the art. Therefore, unless such changes and modifications depart from the scope of the invention, they should be construed as being included therein. Note that identical portions are used in common in different figures in embodiment modes of the present invention that will be explained below.

Embodiment Mode 1

In this embodiment mode, one constitution example of a method for manufacturing a semiconductor device according to the present invention will be explained with reference to drawings.

Figure 1A:
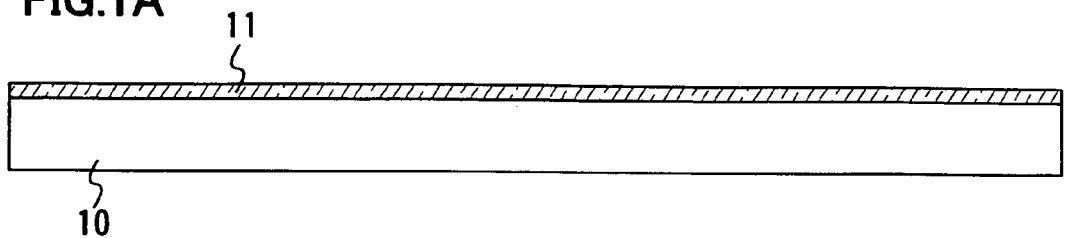
FIGS. 1A to 1E are views each showing a method for manufacturing a semiconductor device according to the present invention (Embodiment Mode 1)

First, a metal film 11 is formed over a surface of a substrate 10 (FIG. 1A). The metal film 11 may be formed in a single layer or a plurality of layers to be stacked. Note that an insulating film may be provided over the substrate 10 before forming the metal film 11. It is preferable to provide an insulating film between the substrate 10 and the metal film 11 particularly when the contamination from the substrate may occur.

As for the substrate 10, a glass substrate, or a heat resistant plastic substrate or the like that can withstand heat treatment in a manufacturing process of a semiconductor device is preferably used. There is no limitation to the area or shape of the substrate in using such a substrate, and thus, a rectangular substrate having one side of 1 meter or more, for example, is used as the substrate 10, so as to enhance the productivity extremely. Such merit is great advantages as compared with a circular silicon substrate. Note that of course it is possible to use a quartz substrate, or a metal substrate or a stainless steel substrate where an insulating film is formed over one surface for the substrate 10. However, these substrates are infinitely inferior to a glass substrate in terms of the cost of the substrate itself, which is not preferable. This is apparent particularly when a large-sized substrate is required, which is not preferable also in consideration of mass production. In this embodiment mode, a glass substrate is used as the substrate 10.

As the metal film 11, a film made of one or more of elements such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the element as the main component is formed in a single layer or a stacked layer. In addition, these materials can be formed by using a known means (a sputtering method or various CVD methods such as a plasma CVD method). In this embodiment mode, tungsten (W) is formed to be 20 to 40 nm thick by a sputtering method as the metal film 11.

As the insulating film provided between the substrate 10 and the metal film 11, a single layer structure of an insulating film at least having oxygen or nitrogen such as silicon oxide ($SiO_x$), silicon nitride ($SiN_x$), a silicon oxide film containing nitrogen ($SiO_xN_y$ film) (x>y) (x and y are positive integers), or a silicon nitride film containing oxygen ($SiN_xO_y$ film) (x>y) (x and y are positive integers), or a stacked structure thereof can be used. These insulating films can be formed by using a known means (a sputtering method or various CVD methods such as a plasma CVD method). In this embodiment mode, a silicon oxide film containing nitrogen is formed to be 50 to 150 nm thick as the insulating film provided between the substrate 10 and the metal film 11.

Figure 1B:
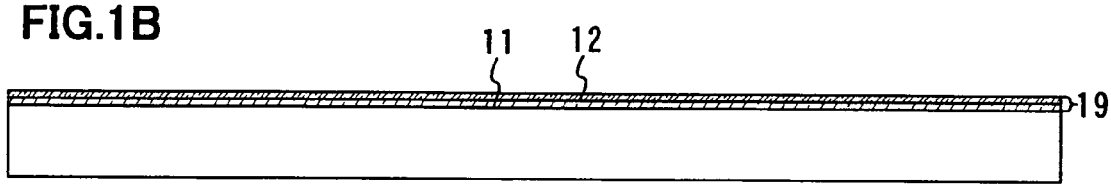

Next, high-density plasma treatment is performed to the metal film 11 in an atmosphere containing oxygen to form a metal oxide film 12 over a surface of the metal film 11 (FIG. 1B). The metal oxide film 12 is formed of an oxide of metal that constitutes the metal film 11. For example, when a tungsten film is used as the metal film 11, a tungsten oxide film is formed as the metal oxide film 12 over a surface of the tungsten film by performing high-density plasma treatment. In this embodiment mode, a layer made of the metal film 11 and the metal oxide film 12 is referred to as a peeling layer 19.

In this specification, high-density plasma treatment is characterized in that an electron density of plasma is $1\times10^{11}$ $cm^{-3}$ or more and $1\times10^{13}$ $cm^{-3}$ or less and an electron temperature of plasma is 0.5 eV or more and 1.5 eV or less. Although the electron density of plasma is high, the electron temperature around an object (the metal film 11) formed over the substrate is low. Thus, plasma damages to the substrate can be prevented. In addition, since the electron density of plasma is as high as $1\times10^{11}$ $cm^{-3}$ or more, the oxide formed by oxidation treatment is superior in evenness of film thickness and it is possible to form a dense film. In addition, since the electron temperature of plasma is as low as 1.5 eV or less, the oxidation treatment can be performed at a lower temperature than conventional plasma treatment or thermal oxidation method. For example, the plasma oxidation treatment can be performed sufficiently even when the plasma treatment is performed at a lower temperature by at least 100° C. than a strain point of a glass substrate (typically, temperatures at 250 to 550° C.). As a power source frequency for generating plasma, a microwave (2.45 GHz) is used. In addition, potential of plasma is as low as 5V or less; thus, excessive dissociation of raw material molecules can be suppressed.

Note that plasma is a state in which an electron is separated from an atom or a molecule, and an ion and an electron are mixed. On the whole, a charge of plasma is neutral. In addition, a plasma density generally means an electron density or an ion density, that is, the number of the charged particles per unit volume. In this specification, a plasma density means an electron density. Moreover, plasma potential means space potential in plasma, which is also referred to as space potential.

The metal oxide film 12 is formed over the surface of the metal film 11 by performing high-density plasma treatment to the surface of metal film in an oxygen atmosphere. For example, when a tungsten film having a thickness of 20 to 40 nm is provided by a sputtering method as the metal film 11, a tungsten oxide having a thickness of 1 to 20 nm can be formed over a surface of the tungsten film by performing high-density plasma treatment to the tungsten film. In this case, the tungsten oxide is expressed by $WO_x$, where "x" is 2 to 3, and there are a case where "x" is 2 ($WO_2$), a case where "x" is 2.5 ($W_2O_5$), a case where "x" is 2.75 ($W_4O_{11}$), a case where "x" is 3 ($WO_3$), and the like. In forming the tungsten oxide, the value of "x" is not particularly limited, and a composition ratio may be determined depending on an etching rate or the like. In this embodiment mode, the metal oxide film 12 is formed over the surface of the metal film 11 by performing high-density plasma treatment to tungsten (W) which is used as the metal film 11 in an oxygen atmosphere.

As a condition of the plasma, an electron density in vicinity of the substrate is $1 \times 10^{11}$ cm$^{-3}$ or more and $1 \times 10^{13}$ cm$^{-3}$ or less, and an electron temperature of plasma is 0.5 eV or more and 1.5 eV or less. As an atmosphere containing oxygen, a mixed gas of oxygen ($O_2$) or dinitrogen monoxide ($N_2O$) and a rare gas, or a mixed gas of oxygen ($O_2$) or dinitrogen monoxide ($N_2O$), a rare gas, and hydrogen ($H_2$) can be used. As the rare gas, argon (Ar), xenon (Xe), and krypton (Kr) can be given as an example. A pressure ratio (flow rate) of each gas in the mixed gas may be appropriately decided. As an example of the combination of the mixed gas, 0.1 to 100 sccm of oxygen (or dinitrogen monoxide) may be contained and 100 to 5000 sccm of argon may be contained. In addition, as another example of the combination of the mixed gas, 0.1 to 100 sccm of oxygen (or dinitrogen monoxide), 0.1 to 100 sccm of hydrogen, and 100 to 5000 sccm of argon may be contained, and it is preferable to introduce the mixed gas in the ratio of oxygen (or dinitrogen monoxide):hydrogen:argon to be 1:1:100. For example, the mixed gas where 5 sccm of oxygen (or dinitrogen monoxide), 5 sccm of hydrogen, and 500 sccm of argon are contained may be introduced. By introducing hydrogen in the mixed gas, processing time of oxidation can be reduced. Under such a condition, the metal oxide film 12 becomes a film containing a rare gas element.

Figure 5:
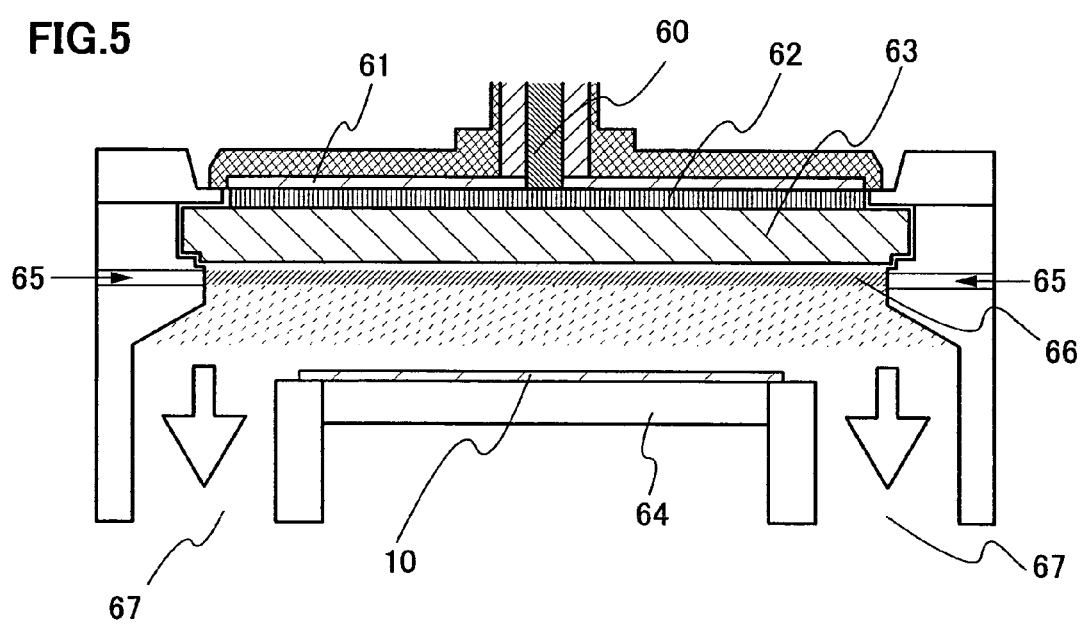
FIG. 5 is a view showing a film forming apparatus (Embodiment Mode 1)

An apparatus shown in FIG. 5 is used as an apparatus for performing high-density plasma treatment. First, the inside of the treatment chamber is evacuated, and a gas including oxygen is introduced through a gas introduction opening 65. In this embodiment mode, the mixed gas of oxygen ($O_2$) or dinitrogen monoxide ($N_2O$), a rare gas, and hydrogen is introduced. Next, the substrate 10 where the metal film 11 is formed is placed in a support stage 64 having a heat mechanism, and the substrate 10 is heated. The heat temperature may range from 200 to 550° C. In this embodiment mode, the substrate 10 is heated at 400° C. In addition, the interval between the substrate 10 and an antenna 62 may be in the range of 20 to 80 mm (preferably, 20 to 60 mm).

Then, a microwave is applied from a waveguide 60 to the antenna 62. In this embodiment mode, a microwave with a power source frequency of 2.45 GHz for generating plasma is supplied. The microwave supplied from the antenna 62 is introduced to the treatment chamber through a dielectric plate 63 in the treatment chamber, thereby generating excited high-density plasma 66 containing a mixed gas of an $O_2$ gas or an $N_2O$ gas, a rare gas, and a hydrogen gas. When an Ar gas is used as the rare gas, for example, the Ar gas introduced in the treatment chamber is excited to generate Ar radical in the excited high-density plasma 66 where an $O_2$ gas or an $N_2O$ gas, a rare gas, and a hydrogen gas are mixed. Then, Ar radical in an intermediate excited state collides with $O_2$ molecules and $N_2O$ molecules to form O radical. The O radical reacts with the metal film 11 to form a metal oxide film over the surface of the metal film 11. In this embodiment mode, since tungsten is used as the metal film 11, a tungsten oxide is formed over the surface of the metal film 11. The $O_2$ gas or $N_2O$ gas, the rare gas, and the hydrogen gas used in this step are exhausted outside the treatment chamber through an exhaust port 67.

The plasma generated using the plasma apparatus shown in FIG. 5 has a low electron temperature (1.5 eV or less) and a high electron density ($1.0 \times 10^{11}$ cm$^{-3}$ or more). Therefore, a metal oxide film with little plasma damage can be formed at a low temperature.

As a film thickness of the peeling layer increases, the peeling layer also absorbs energy at the time of laser irradiation when a laser crystallization process is used in a thin film transistor included in an element layer to be formed subsequently. Therefore, as the film thickness of the peeling layer increases, possibility that the film of the peeling layer is peeled becomes high. By applying the present invention, it is possible to form a peeling layer having a metal oxide film superior in evenness of a film thickness even when the film is as extremely thin as 20 nm or less. Thus, the film of the peeling layer is not peeled even in the subsequent step and it is possible to manufacture a semiconductor device with high reliability. In addition, since the peeling layer having a metal oxide film superior in evenness of a film thickness can be formed, it is possible to solve a conventional problem that a peeling layer is not formed over part of a substrate, which cannot be peeled off.

Figure 1C:
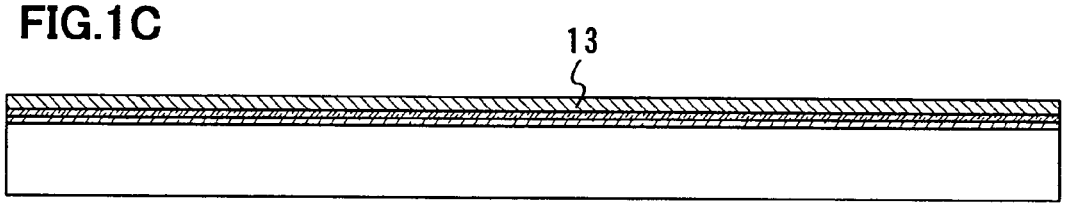

Subsequently, an insulating film 13 is formed over the metal oxide film 12 (FIG. 1C). The insulating film 13 may be provided in a single layer or may be provided by stacking a plurality of films. The insulating film 13 serves as a base film that prevents alkaline metal such as sodium (Na) contained in a glass substrate or the like from entering an element such as a thin film transistor included in an element 14 to be provided subsequently. Therefore, hereinafter, the insulating film 13 may be referred to as a base film.

The insulating film 13 can be formed by using a single layer structure of an insulating film at least having oxygen or nitrogen such as silicon oxide ($SiO_x$), silicon nitride ($SiN_x$), a silicon oxide film containing nitrogen ($SiO_xN_y$ film) (x>y) (x and y are positive integers), or a silicon nitride film containing oxygen ($SiN_xO_y$ film) (x>y) (x and y are positive integers), or a stacked structure thereof by a known means (a sputtering method or various CVD methods such as a plasma CVD method). For example, when the insulating film 13 is provided in a two-layer structure, a silicon nitride oxide film may be formed as an insulating film in the first layer and silicon oxynitride film may be formed as an insulating film in the second layer. In addition, when the insulating film 13 is provided in a two-layer structure, a silicon oxynitride film may be formed as an insulating film in the first layer, a silicon nitride oxide film may be formed as an insulating film in the second layer, and a silicon oxynitride film may be formed as an insulating film in the third layer. Alternatively, a silicon oxide film may be formed as an insulating film in the first layer, a silicon nitride oxide film may be formed as an insulating film in the second layer, and a silicon oxynitride film may be formed as an insulating film in the third layer. In this embodiment mode, the insulating film 13 is formed to have a two-layer structure of a silicon oxide film where a surface thereof is plasma nitrided and a silicon oxide film containing nitrogen, which is formed by performing high-density plasma treatment in an atmosphere containing nitrogen after forming the silicon oxide film. As a condition of the plasma, an electron density in vicinity of the substrate is $1 \times 10^{11}$ cm$^{-3}$ or more and $1 \times 10^{13}$ cm$^{-3}$ or less, and an electron temperature of plasma is 0.5 eV or more and 1.5 eV or less. As an atmosphere containing nitrogen, a mixed gas of nitrogen ($N_2$) or ammonia ($NH_3$) and a rare gas, or a mixed gas of nitrogen ($N_2$) or ammonia ($NH_3$), a rare gas, and hydrogen ($H_2$) can be used. As the rare gas, argon (Ar), xenon (Xe), and krypton (Kr) can be given as an example. Under such a condition, the insulating film 13 becomes a film containing a rare gas element.

As an example of the combination of the mixed gas, 20 to 2000 sccm of nitrogen (or ammonia) and 100 to 10000 sccm of argon may be contained. In addition, as another example of the combination of the mixed gas, 20 to 2000 sccm of nitrogen (or ammonia), 1 to 500 sccm of hydrogen, and 100 to 10000 sccm of argon may be contained, and it is preferable to introduce the mixed gas in the ratio of nitrogen (or ammonia):hydrogen:argon to be 20:1:100. For example, the mixed gas where 100 sccm of nitrogen (or ammonia), 5 sccm of hydrogen, and 500 sccm of argon are contained may be introduced. By introducing hydrogen in the mixed gas, processing time of nitriding can be reduced.

Figure 1D:
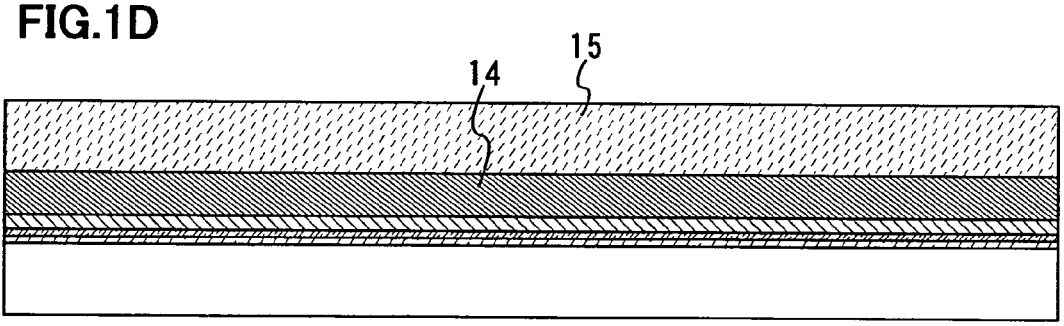

Next, a layer 14 provided with an element such as a thin film transistor (hereinafter, referred to as an element layer 14) is formed over the insulating film 13. Subsequently, an insulating film 15 is formed over the element layer 14 (FIG. 1D). The insulating film 15 serves as a protective layer to retain a certain degree of strength of the element layer 14; therefore, hereinafter, the insulating film 15 may be referred to as a protective layer in this specification. It is preferable that the insulating film 15 is formed so as to cover also the side surface of the element layer 14. In addition, in this embodiment mode, although the insulating film 15 is provided so as to cover one entire surface of the element layer 14, the insulating film 15 is not necessarily provided over one entire surface of the element layer 14 and the insulating film 15 may be provided selectively over part of one surface of the element layer 14.

The element layer 14 includes at least a thin film transistor (TFT), and any kinds of integrated circuits such as a CPU, a memory, or a microprocessor can be formed by using the thin film transistor. In addition to a thin film transistor, a mode having an antenna can be applied to the element layer 14. For example, an integrated circuit constituted with the use of a thin film transistor performs an operation by using an AC voltage generated at the antenna and transmission to a reader/writer can be performed by modulating an AC voltage that is applied to the antenna. The antenna may be formed in the element layer 14 along with the thin film transistor or may be formed separately from the thin film transistor and provided so as to be electrically connected thereto subsequently.

The thin film transistor can be formed using an amorphous semiconductor film or a crystalline semiconductor film; however, a crystalline semiconductor film may be used when it is desired to form a higher-performance thin film transistor. In this case, after forming an amorphous semiconductor film over the insulating film 13 by a known method (a sputtering method, an LPCVD method, a plasma CVD method, or the like), the amorphous semiconductor film is crystallized to form a semiconductor film. As an example of a crystallization method, a laser crystallization method, a thermal crystallization method using an RTA or an annealing furnace, a thermal crystallization method using a metal element for promoting crystallization, a method in which the thermal crystallization method using a metal element for promoting crystallization is combined with the laser crystallization method, and the like can be given. In addition, as another crystallization method, the amorphous semiconductor film may be crystallized by applying DC bias to generate thermal plasma and by acting the thermal plasma on the semiconductor film.

In addition, a semiconductor film configuring the thin film transistor may have any structures; for example, an impurity region (including a source region, a drain region, and an LDD region) may be formed. The thin film transistor may be a P-channel type, an N-channel type, or a CMOS circuit. Moreover, an insulating film (a sidewall) may be formed so as to be in contact with a side surface of a gate electrode provided above the semiconductor film, and a silicide layer formed of nickel, molybdenum, cobalt, or the like may be formed for one or both of source and drain regions and a gate electrode.

The insulating film 15 is formed of a film containing carbon such as DLC (Diamond-Like Carbon), a silicon oxide film containing nitrogen, a silicon nitride film containing oxygen, a film formed from a resin material such as epoxy or other organic material, or the like. Note that such a film can be formed by using a known means (a sputtering method, various CVD methods such as a plasma CVD method, a spin coating method, a droplet discharging method, or a printing method).

Figure 1E:
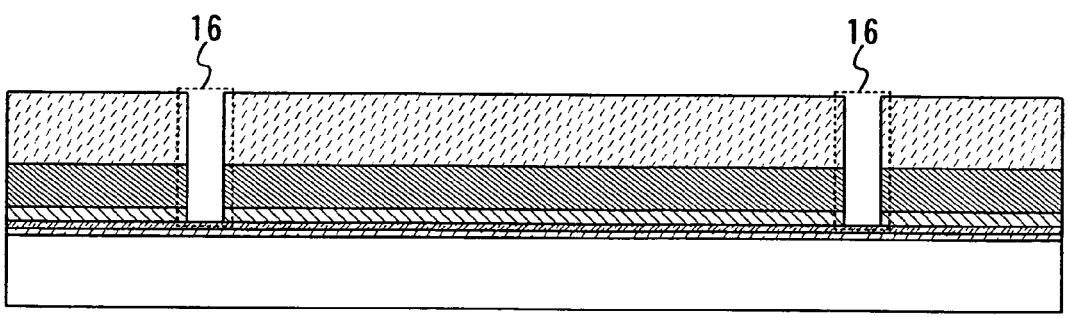

Then, an opening 16 is formed in the insulating film 13, the element layer 14, and the insulating film 15 to expose the peeling layer 19 (FIG. 1E). By forming the opening 16, an element can be easily peeled off the substrate 10 in the subsequent peeling step. In addition, it is preferable that the opening 16 is provided in a region where an element such as the thin film transistor that constitutes the element layer 14 is avoided or at an end portion of the substrate 10. Moreover, the opening 16 can be formed by irradiating laser light (for example, UV light), or grinding and cutting an end surface of a sample.

Figure 2A:
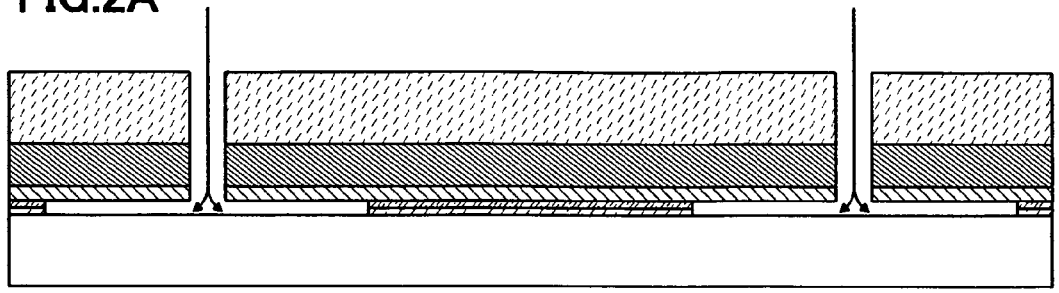
FIGS. 2A to 2D are views each showing a method for manufacturing a semiconductor device according to the present invention (Embodiment Mode 1)

Subsequently, an etchant is introduced from the opening 16, if necessary, and the peeling layer 19 is removed selectively (FIG. 2A). Although an element can be easily peeled off the substrate 10 in the subsequent peeling step by removing the peeling layer 19 selectively, this step may be omitted. The peeling layer 19 may be totally removed or may be removed so that part of the peeling layer remains. By leaving part of the peeling layer 19, the insulating film 13 and the element layer 14 can be held over the substrate 10 even after removing the peeling layer. In addition, by processing without totally removing the peeling layer 19, consumption of the etchant can be reduced and processing time can be reduced; thus, cost reduction and high efficiency can be realized.

As the etchant, a gas or a liquid containing halogen fluoride such as a chlorine trifluoride gas, or halogen can be used. Besides, $CF_4$, $SF_6$, $NF_3$, $F_2$, or the like can also be used.

Figure 2B:
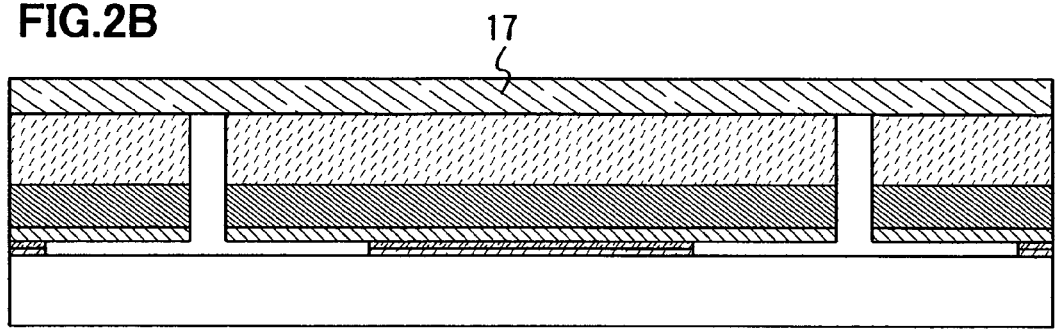

Next, a first sheet material 17 is provided over the insulating film 15 (FIG. 2B). The first sheet material 17 has adhesiveness at least on one surface, and the insulating film 15 and the first sheet material 17 may be attached to each other.

As the first sheet material 17, a flexible film (flexible substrate) may be used and at least one surface thereof is provided with an adhesive surface. For example, a sheet material obtained by providing adhesive onto a base film used as a base material such as polyester can be used. As the adhesive, a resin material including an acrylic resin or the like or a material made of a synthetic rubber material can be used.

Figure 2C:
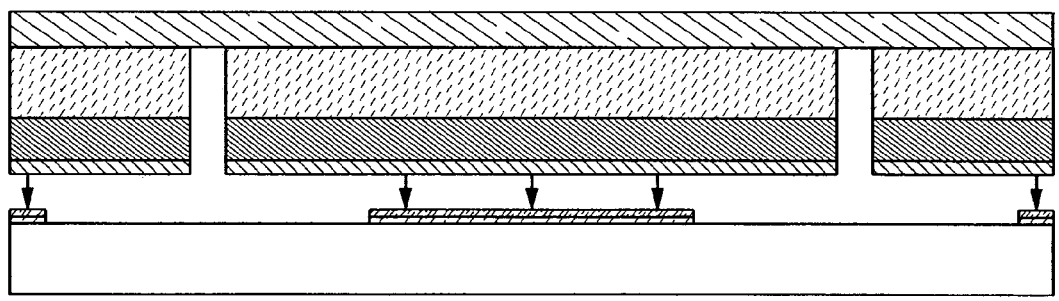

Next, the insulating film 13 (a base film), the element layer 14, and the insulating film 15 (a protective layer) are peeled off the substrate 10 (FIG. 2C). When part of the peeling layer 19 remains between the substrate 10 and the insulating film 13, the insulating film 13 (a base film), the element layer 14, and the insulating film 15 (a protective layer) are peeled off the substrate 10 with the use of a physical means. In this case, since the adhesiveness between the insulating film 13 and the peeling layer 19 is decreased by using the peeling layer 19 that is provided with the above method, the peeling can be performed easily even with a physical means. Note that, since the peeled substrate 10 can be reused, a semiconductor device can be manufactured at lower cost. For example, there is such a merit that even in a case of using a quartz substrate the cost of which is high, a semiconductor device can be manufactured at low cost by using the quartz substrate repeatedly.

Note that the physical means is a means recognized not by chemistry but by physics, which specifically means a dynamic means or a mechanical means having a step applicable to Law of Dynamic and a means of changing some sort of dynamic energy (mechanical energy). That is, peeling using the physical means is to peel by a shock (stress) externally using a human hand, pressure of a gas emitted from a nozzle, ultrasonic waves, a load using a cuneate member, or the like.

Figure 2D:
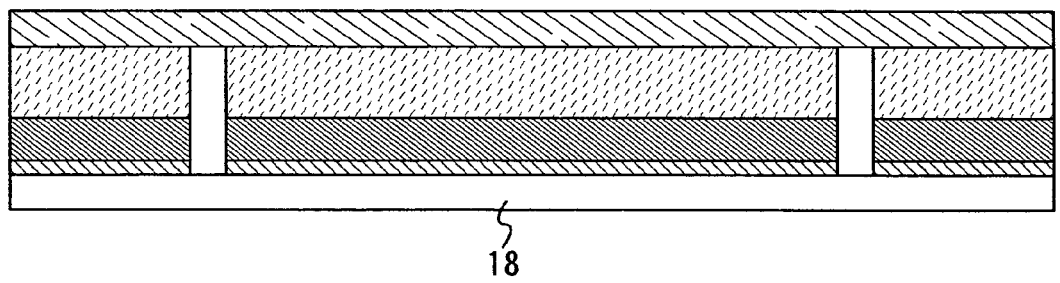

Then, a second sheet material 18 is provided on one surface of the insulating film 13 (a base film), the element layer 14, and the insulating film 15 (a protective layer) which are peeled off the substrate 10 (FIG. 2D). The second sheet material 18 is provided by performing one or both of heat treatment and pressure treatment after being attached to the insulating film 13. By providing the second sheet material 18, the strength of the insulating film 13 and the element layer 14 is enhanced and moisture, contaminant, and the like can be prevented from entering. Note that a similar sheet material to the second sheet material 18 may be provided on the opposite side to the side provided with the second sheet material 18 of the element layer 14 in order to seal. In this case, when manufacturing a semiconductor device thinner, the sealing is preferably performed by providing a sheet material after the first sheet material 17 is removed.

As the second sheet material 18, a flexible film (flexible substrate) can be used; for example, a film formed of polypropylene, polyester, vinyl, polyvinyl fluoride, vinyl chloride, or the like, paper made of a fibrous material, a stacked film structured by a base material film (polyester, polyamide, an inorganic deposition film, paper, or the like) and an adhesive synthetic resin film (an acrylic synthetic resin, an epoxy synthetic resin, or the like), or the like can be used. In addition, in attaching the film to the element layer by performing heat treatment or pressure treatment, an adhesive layer which is provided in the outermost surface of the film or a layer (not an adhesive layer) which is provided in the outermost layer thereof is melted by heat treatment, and then pressure is applied, thereby the film is attached. Moreover, when the element layer is sealed with the first sheet material 17 and the second sheet material 18, sealing may be performed by using a similar sheet material to the first sheet material 17.

As mentioned above, an element layer is once provided over a rigid substrate such as glass, and then the element layer is peeled off the substrate so that a flexible semiconductor device can be manufactured by displacing the element layer over a flexible substrate. Further, by employing the method described in this embodiment mode, a peeling layer is formed and peeling is performed so that a semiconductor device with high reliability can be manufactured at low cost.

Embodiment Mode 2

In this embodiment mode, a method for manufacturing a semiconductor device different from that in the above embodiment mode in forming a peeling layer will be explained with reference to drawings.

Figure 3:
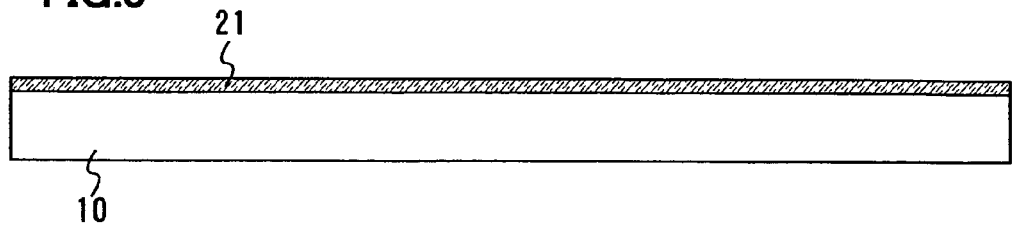
FIG. 3 is a view showing a method for manufacturing a semiconductor device according to the present invention (Embodiment Mode 2)

First, a peeling layer formed of a metal oxide film 21 is formed over a surface of a substrate 10 (FIG. 3). The metal oxide film 21 may be formed in a single layer or a plurality of layers to be stacked. Note that an insulating film may be provided over the substrate 10 before forming the metal oxide film 21. It is preferable to provide an insulating film between the substrate 10 and the metal oxide film 21 particularly when the contamination from the substrate may occur.

As the metal oxide film 21, an oxide of one or more of metal elements such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an oxide film of an alloy material containing the element as the main component is formed in a single layer or a stacked layer. For example, a molybdenum oxide film ($MoO_x$, x=2 to 3), a niobium oxide film ($NbO_x$), or a titanium oxide film ($TiO_x$) can be used.

The metal oxide film 21 is formed using plasma in an atmosphere containing oxygen. A condition of the plasma treatment is characterized in that an electron density of plasma is $1\times10^{11}$ cm$^{-3}$ or more and $1\times10^{13}$ cm$^{-3}$ or less and an electron temperature of plasma is 0.5 eV or more and 1.5 eV or less. Although the electron density of plasma is high, the electron temperature around a substrate is low. Thus, plasma damages to the substrate can be prevented. In addition, since the electron density of plasma is as high as $1\times10^{11}$ cm$^{-3}$ or more, the metal oxide film to be formed has a superior evenness of film thickness and it is possible to form a dense film. In addition, since the electron temperature of plasma is as low as 1.5 eV or less, the metal oxide film can be formed at a lower temperature than conventional plasma treatment or thermal oxidation method. For example, the metal oxide film can be formed even when plasma is used at a lower temperature by at least 100° C. than a strain point of a glass substrate. As the power source frequency for generating plasma, a microwave (2.45 GHz) is used. The metal oxide film 21 may be formed to be 1 to 40 nm thick and a tungsten oxide film is formed to be 30 nm thick as the metal oxide film 21 in this embodiment mode. As an atmosphere containing oxygen, a mixed gas of $O_2$ or $N_2O$ and a rare gas, or a mixed gas of $O_2$ or $N_2O$, a rare gas, and hydrogen may be used. Under such a condition, the metal oxide film 21 becomes a film containing a rare gas element.

As a film thickness of the peeling layer increases, the peeling layer also absorbs energy at the time of laser irradiation when a laser crystallization process is used in a thin film transistor included in an element layer to be formed subsequently. Therefore, as the film thickness of the peeling layer increases, possibility that the film of the peeling layer is peeled becomes high. When the method described in this embodiment mode is employed, it is possible to form a peeling layer having a metal oxide film superior in evenness of a film thickness even when the film is as extremely thin as 40 nm or less. Thus, the film of the peeling layer is not peeled even in the subsequent step and it is possible to manufacture a semiconductor device with high reliability. In addition, since the peeling layer having a metal oxide film superior in evenness of a film thickness can be formed, it is possible to solve a conventional problem that a peeling layer is not formed over part of a substrate, which cannot be peeled off.

Thereafter, a semiconductor device with high reliability can be manufactured in high yields through similar steps as those shown in FIGS. 1C to 1E and FIGS. 2A to 2D which are shown in the above embodiment mode.

This embodiment mode can be implemented combining arbitrarily with the above embodiment modes. In other words, the materials and the forming methods shown in Embodiment Mode 1 described above can also be used in this embodiment mode by being combined arbitrarily.

Embodiment Mode 3

In this embodiment mode, a case of continuously forming an amorphous semiconductor film of a thin film transistor including a peeling layer, an insulating film (a base film), and an element layer over a glass substrate will be explained with reference to drawings.

Figure 4:
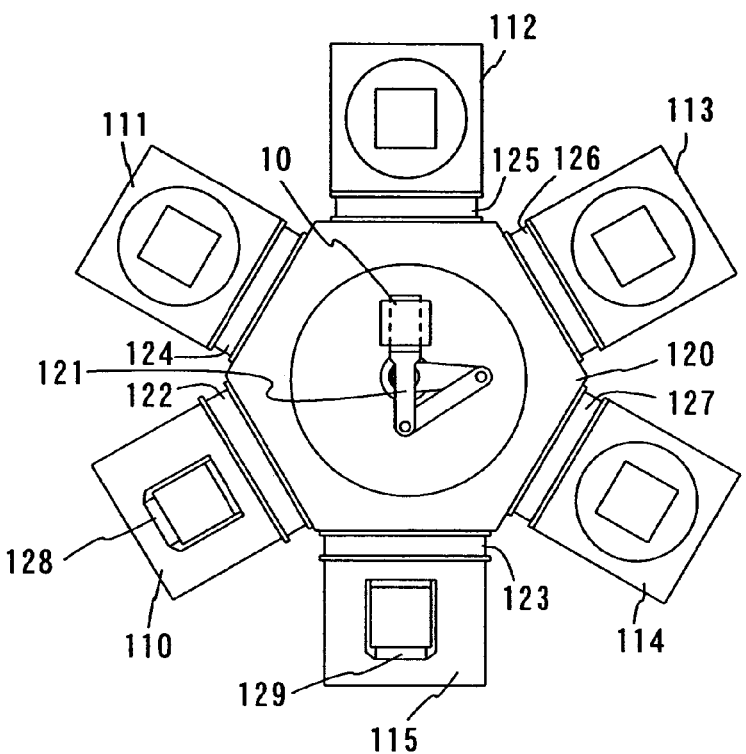
FIG. 4 is a view showing a film forming apparatus (Embodiment Mode 3)

An example of an apparatus having a plurality of chambers (multichamber) is shown in FIG. 4. Note that FIG. 4 is a top view of one structural example of an apparatus (continuous film forming system) shown in this embodiment mode.

The apparatus shown in FIG. 4 has a first chamber 111, a second chamber 112, a third chamber 113, and a fourth chamber 114, load lock chambers 110 and 115, and a common chamber 120 each of which has airtightness. Each chamber is provided with a vacuum evacuation pump and an inert gas introduction system.

The load lock chambers 110 and 115 are chambers for carrying a sample (a substrate to be processed) to a system. The first to fourth chambers are chambers for forming an amorphous semiconductor film of a thin film transistor including a peeling layer, an insulating film (a base film), and an element layer over a substrate, or for performing etching, plasma treatment, or the like. The common chamber 120 is provided to be in common for the load lock chambers 110 and 115 and the first to fourth chambers. In addition, gate valves 122 to 127 are provided between the common chamber 120 and the load lock chambers 110 and 115, and between the common chamber 120 and the first to fourth chambers 111 to 114. Note that a robot arm 121 is provided in the common chamber 120, which transfers the substrate to be processed to each chamber.

Hereinafter, as a specific example, an example where a metal film 11 is formed over a substrate 10 in the first chamber 111, plasma treatment is performed in the second chamber 112 to form a metal oxide film 12, an insulating film 13 is formed in the third chamber 113, and an amorphous semiconductor film is formed in the fourth chamber 114 will be shown.

First, a cassette 128 containing a plurality of the substrates 10 is carried to the load lock chamber 110. After the cassette 128 is carried therein, a door of the load lock chamber 110 is closed. In this state, the gate valve 122 is opened to take out one substrate to be processed out of the cassette 128, and then the substrate is disposed in the common chamber 120 by the robot arm 121. Alignment of the substrate 10 is performed in the common chamber 120 at this time.

Next, the gate valve 122 is closed and the gate valve 124 is opened to transfer the substrate 10 to the first chamber 111. Film formation process is performed in the first chamber 111 so that the metal film 11 is formed over the substrate 10. For example, a tungsten (W) film can be formed in the first chamber 111 by a plasma CVD method or a sputtering method using tungsten (W) as a target.

After forming the metal film 11, the substrate 10 is taken out to the common chamber 120 by the robot arm 121, and transferred to the second chamber 112. In the second chamber 112, plasma treatment is performed to the metal film 11 in an oxygen atmosphere so that the metal oxide film 12 is formed over a surface of the metal film. For example, a tungsten oxide film ($WO_x$) can be formed in the second chamber 112 by performing plasma treatment to the tungsten film. A condition of the plasma treatment is as explained in Embodiment Mode 1 or Embodiment Mode 2; thus, the explanation is omitted here.

After forming the metal oxide film 12, the substrate 10 is taken out to the common chamber 120 by the robot arm 121, and transferred to the third chamber 113. In the third chamber 113, film formation process is performed at temperatures from 150 to 300° C., and the insulating film 13 is formed. As the insulating film 13, a single layer film of an insulating film containing oxygen or nitrogen such as silicon oxide, silicon nitride, silicon oxide containing nitrogen, or silicon nitride containing oxygen, or a stacked film thereof can be formed. For example, in the third chamber 113, by a plasma CVD method, a silicon oxide film containing nitrogen can be formed as an insulating film in the first layer, a silicon nitride film containing oxygen can be formed as an insulating film in the second layer, and a silicon oxide film containing nitrogen can be formed as an insulating film in the third layer. Note that the method is not limited to a plasma CVD method; however, a sputtering method using a target may also be used.

After forming the insulating film 13, the substrate 10 is taken out to the common chamber 120 by the robot arm 121, and transferred to the fourth chamber 114. In the fourth chamber 114, film formation process is performed at temperatures from 150 to 300° C., and an amorphous semiconductor film is formed by a plasma CVD method. Note that the amorphous semiconductor film can be formed from a microcrystal semiconductor film, an amorphous germanium film, an amorphous silicon germanium film, a stacked film of such films, or the like. In addition, the formation temperature of the amorphous semiconductor film is set 350 to 500° C., and heat treatment for reducing the hydrogen concentration may be omitted. Here, the plasma CVD method is adopted; however, a sputtering method using a target may be adopted.

After forming the amorphous semiconductor film in the above manner, the substrate 10 is transferred to the load lock chamber 115 by the robot arm 121 to be stored in a cassette 129.

Note that FIG. 4 shows just an example. For example, a conductive film or an insulating film may be formed continuously after increasing the number of chambers and forming the amorphous semiconductor film. Alternatively, as shown in Embodiment Mode 2 mentioned above, in the first chamber 111, the metal oxide film 21 may be formed by a CVD method with the use of high-density plasma in an atmosphere containing oxygen. In other words, the steps and materials described in the above embodiment modes can be used to arbitrarily combine the apparatus shown in FIG. 4. In addition, although description is made on an example where single type chambers are employed for the first to fourth chambers 111 to 114 in FIG. 4, a structure in which a plurality of substrates is processed all at once by employing a batch type chamber may also be adopted.

By using the apparatus shown in this embodiment mode, the peeling layer, the insulating film (a base film), and the semiconductor film can be formed continuously without being exposed to an atmosphere. Thus, it is possible to prevent mixture of contamination, which occurs in carrying a substrate, or to improve production efficiency.

Embodiment Mode 4

In this embodiment mode, a method for manufacturing a semiconductor device according to the present invention including a thin film transistor and antenna will be explained with reference to drawings. In particular, a structure of an element layer will be explained in detail.

Figure 6A:
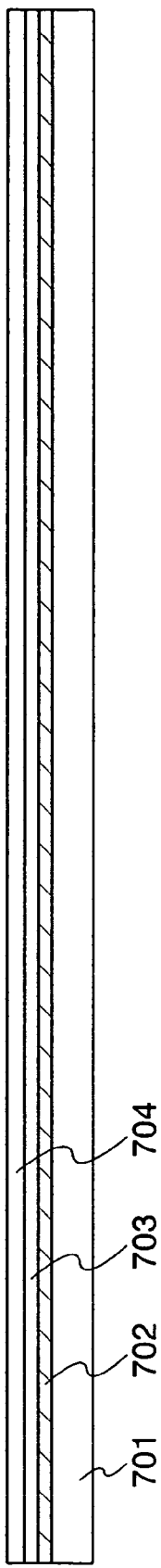
FIGS. 6A to 6C are views each showing a method for manufacturing a semiconductor device according to the present invention (Embodiment Mode 4)

First, a peeling layer 702 and a base film 703 are formed over a substrate 701 (FIG. 6A). As for the forming method or the material of the substrate 701, the peeling layer 702, and the base film 703, the explanation in Embodiment Mode 1 or Embodiment Mode 2 can be arbitrarily combined; thus, the explanation is omitted here.

Figure 6B:
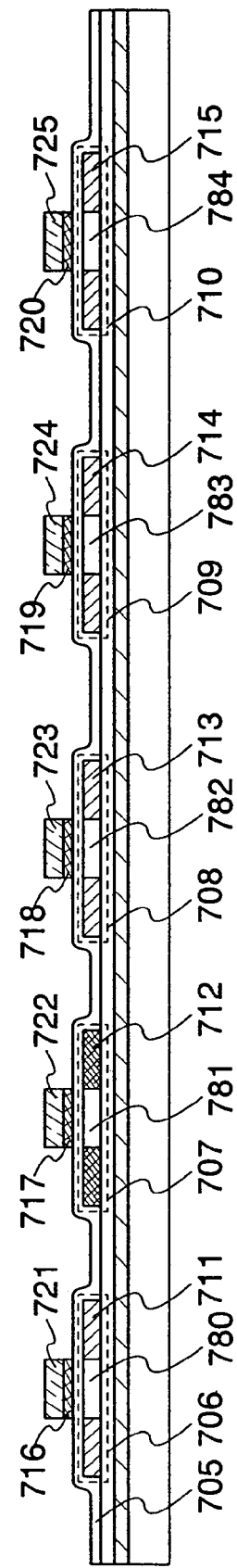

Next, an amorphous semiconductor film 704 (for example, a film containing amorphous silicon as its main component) is formed over the base film 703. The amorphous semiconductor film 704 is formed to be 25 to 200 nm thick (preferably, 30 to 150 nm thick) by a known means (a sputtering method, an LPCVD method, a plasma CVD method, or the like). Subsequently, the amorphous semiconductor film 704 is crystallized by a known crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor film. The obtained crystalline semiconductor film is then patterned into a desired shape; therefore, crystalline semiconductor films 706 to 710 are formed (FIG. 6B). Note that the peeling layer 702, the base film 703, and the amorphous semiconductor film 704 can be formed continuously without being exposed to an atmosphere as shown in Embodiment Mode 3 and FIG. 4 described above. Note that patterning in this specification means to etch in a desired shape.

Hereinafter, an example of a manufacturing process of the crystalline semiconductor films 706 to 710 will be explained briefly. First, an amorphous semiconductor film is formed to be 40 to 300 nm thick by a plasma CVD method. Next, a solution containing nickel that is a metal element for promoting crystallization is applied onto the amorphous semiconductor film, and dehydrogenation treatment (at 500° C., for 1 hour) and thermal crystallization treatment (at 550° C., for 4 hours) are performed to the amorphous semiconductor film; therefore, a crystalline semiconductor film is formed. Thereafter, the crystalline semiconductor film is irradiated with laser light, if necessary, and patterning treatment using a photolithography method is performed to form the crystalline semiconductor films 706 to 710.

In the case where the laser crystallization method is employed for forming the crystalline semiconductor film, a gas laser or a solid laser of a continuous oscillation or a pulsed oscillation is used. As the gas laser, an excimer laser, a YAG laser, a $YVO_4$ laser, a YLF laser, a $YAlO_3$ laser, a glass laser, a ruby laser, a Ti: sapphire laser, or the like is used. As the solid laser, a laser using a crystal such as YAG, $YVO_4$, YLF, or $YAlO_3$ doped with Cr, Nd, Er, Ho, Ce, Co, Ti, or Tm is used. In particular, by irradiating a fundamental wave of the continuous oscillation laser, or a harmonic wave from second to fourth harmonic waves of the fundamental wave, large grain crystals can be obtained. For example, a second harmonic (532 nm) or a third harmonic (355 nm) of a $Nd:YVO_4$ laser (a fundamental wave of 1064 nm) can be used. Note that laser light of a fundamental wave of a continuous wave laser and laser light of a harmonic of a continuous wave laser may be irradiated, or laser light of a fundamental wave of a continuous wave laser and laser light of a harmonic of a pulsed laser may be irradiated. By irradiating a plurality of kinds of laser light, energy can be compensated. In addition, if a pulse oscillation laser oscillates the laser beam with a repetition rate for irradiating the next pulsed laser light until a semiconductor film which has been melted by the previous laser light is solidified, crystal grains grown continuously in the scanning direction can be formed. In other words, a pulsed oscillation laser which can be used here has a repetition rate a lower limit of which is set such that the pulse repetition period is shorter than a period for solidifying completely the semiconductor film which has been melted. As such laser, pulsed oscillation laser light having a repetition rate of 10 MHz or more may be used.

In addition, the crystallization of the amorphous semiconductor film by using the metal element for promoting crystallization is advantageous in that the crystallization can be performed at low temperature in short time and the direction of crystals becomes uniform, while there is a problem in that the property is not stable because the OFF current is increased due to a residue of the metal element in the crystalline semiconductor film. Therefore, it is preferable to form an amorphous semiconductor film as a gettering site over the crystalline semiconductor film. In order to form a gettering site, the amorphous semiconductor film is required to contain an impurity element such as phosphorous and argon; therefore, the amorphous semiconductor film is preferably formed by a sputtering method by which argon can be contained at a high concentration. Thereafter, heat treatment (an RTA method, thermal annealing using an annealing furnace, or the like) is performed to diffuse the metal element into the amorphous semiconductor film, and the amorphous semiconductor film containing the metal element is removed. The content of the metal element in the crystalline semiconductor film can be reduced or removed by performing such a gettering process.

Then, a gate insulating film 705 is formed to cover the crystalline semiconductor films 706 to 710. The gate insulating film 705 is formed by a single layer or stacked layer of a film containing oxide of silicon or nitride of silicon by a known means (a plasma CVD method or a sputtering method). Specifically, a film containing silicon oxide, a film containing silicon oxynitride, or a film containing silicon nitride oxide is formed in a single layer structure or formed by appropriately stacking these films.

Subsequently, a first conductive film and a second conductive film are stacked over the gate insulating film 705. The first conductive film is formed to be 20 to 100 nm thick by a known means (a plasma CVD method or a sputtering method). The second conductive film is formed to be 100 to 400 nm thick by a known means. The first conductive film and the second conductive film are formed by using one or more elements of tantalum (Ta), tungsten (W), titanium (Ti), molybdenum (Mo), aluminum (Al), copper (Cu), chromium (Cr), niobium (Nb), and the like, or an alloy material or a compound material containing these elements as its main component. Alternatively, a semiconductor material typified by poly-crystalline silicon doped with an impurity element such as phosphorus may be used. As a combination of the first conductive film and the second conductive film, a titanium nitride (TaN) film and a tungsten (W) film, a tungsten nitride (WN) film and a tungsten film, a molybdenum nitride (MoN) film and a molybdenum (Mo) film, or the like can be given for example. Since tungsten or titanium nitride has high heat resistance, heat treatment in order to perform thermal activation can be performed after the first conductive film and the second conductive film are formed. Alternatively, a single-layer structure or a three-layer structure may be employed instead of the two-layer structure of the first conductive film and the second conductive film. In a case of employing the three-layer structure, it is preferable to employ a stacked layer structure where a molybdenum film, an aluminum film, and a molybdenum film are sequentially stacked on a substrate side or a structure where a titanium film, an aluminum film, and a titanium film are sequentially stacked on a substrate side.

Next, a resist mask is formed by a photolithography method and etching treatment for forming a gate electrode and a gate line is performed to form conductive films (hereinafter, also referred to as gate electrodes in this specification) 716 to 725 each serving as a gate electrode.

Then, a resist mask is newly formed by a photolithography method. Thereafter, an impurity element imparting N-type conductivity is added into the crystalline semiconductor films 706, and 708 to 710 at a low concentration by an ion doping method or an ion implantation method to form N-type impurity regions 711, and 713 to 715 and channel forming regions 780, and 782 to 784. An element belonging to group 15 may be used for the impurity element imparting N-type conductivity and, for example, phosphorus (P) or arsenic (As) is used.

Subsequently, a resist mask is formed by a photolithography method. Thereafter, an impurity element imparting P-type conductivity is added into the crystalline semiconductor film 707 to form a P-type impurity region 712 and a channel forming region 781. For example, boron (B) is used for the impurity element imparting P-type conductivity. Note that, as for the order of forming the N-type impurity regions 711, and 713 to 715 and the P-type impurity region 712, the P-type impurity region 712 may also be formed after forming the N-type impurity regions 711, and 713 to 715 like this embodiment mode, or the N-type impurity regions 711, and 713 to 715 may also be formed after forming the P-type impurity region 712.

Figure 6C:
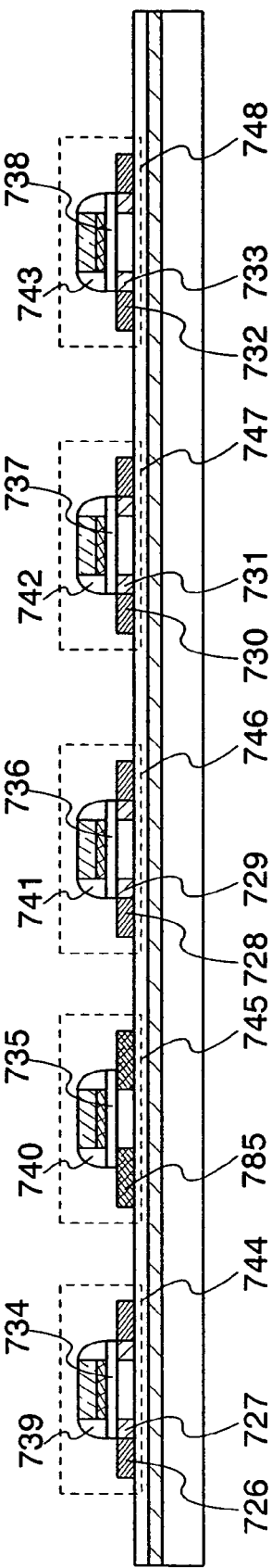

Next, an insulating film is formed so as to cover the gate insulating film 705 and the conductive films 716 to 725. The insulating film is formed by a single layer or stacked layer of a film made of an inorganic material such as silicon, oxide of silicon, or nitride of silicon, or a film made of an organic material such as an organic resin by a known means (a plasma CVD method or a sputtering method). Then, the insulating film is selectively etched by anisotropic etching which is mainly in the vertical direction to form insulating films (also referred to as sidewalls) 739 to 743 in contact with the side surfaces of the conductive films 716 to 725 (FIG. 6C). Concurrently with manufacturing the insulating films 739 to 743, insulating films 734 to 738 are formed by etching the insulating film 705. The insulating films 739 to 743 are used as masks for doping in forming an LDD (Lightly Doped Drain) region subsequently.

Then, a resist mask is formed by a photolithography method. Using the resist mask and the insulating films 739 to 743 as masks, an impurity element imparting N-type conductivity is added into the crystalline semiconductor films 706, and 708 to 710 so that first N-type impurity regions (also referred to as LDD regions) 727, 729, 731, and 733 and second N-type impurity regions 726, 728, 730, and 732 are formed. The concentration of the impurity element in the first N-type impurity regions 727, 729, 731, and 733 is lower than the concentration of the impurity element in the second N-type impurity regions 726, 728, 730, and 732. As a result of the above steps, N-type thin film transistors 744, and 746 to 748 and a P-type thin film transistor 745 are completed.

Note that there are the following two methods for forming the LDD region. In one method, a gate electrode is formed in a stacked layer structure having two or more layers, and taper etching or anisotropic etching is performed so that the gate electrode has a tapered shape and a conductive film of the lower layer included in the gate electrode is used as a mask. In the other method, a sidewall insulating film is used as a mask. A thin film transistor that is formed by the former method has a structure in which an LDD region is overlapped with a gate electrode with a gate insulating film interposed therebetween. However, this structure, which utilizes taper etching or anisotropic etching which is performed so that the gate electrode has a tapered shape, is difficult to control the width of the LDD region, and the LDD region may not be formed if the etching step is not performed preferably. On the other hand, the latter method which uses a sidewall insulating film as a mask is, as compared to the former method, easy to control the width of the LDD region and can form the LDD region certainly.

Subsequently, after removing a natural oxide film formed over a surface of the exposed N-type impurity regions 726, 728, 730, 732, and the P-type impurity region 785, a silicide region may be formed using a metal film. As the metal film, a nickel film, a titanium film, a cobalt film, a platinum film, a film made of an alloy containing at least two kinds of these elements, or the like can be used. More specifically, for example, a nickel film is used as the metal film to form the silicide region by heat treatment after forming the nickel film at a room temperature with a deposition power of 500 W to 1 kW by a sputtering method. As the heat treatment, RTA, furnace annealing, or the like can be used. At this time, by controlling a film thickness, a heating temperature, and a heating time of the metal film, it is also possible to have the silicide region only on surfaces of the N-type impurity regions 726, 728, 730, 732, and the P-type impurity region 785, or the silicide region can be formed in an entire region of the impurity region. Lastly, nickel which has not reacted is removed. For example, nickel which has not reacted is removed by using an etching solution composed of HCl:$HNO_3$:$H_2O$=3:2:1.

Through the above steps, after completing the N-type thin film transistors 744, and 746 to 748, and the P-type thin film transistor 745, heat treatment in order to recover the crystallinity of the semiconductor films or activate the impurity element which has been added into the semiconductor films may be performed. In addition, preferably, after performing the heat treatment, hydrogen may be made to contain in a surface of the exposed gate insulating film 705 by performing high-density plasma treatment to the gate insulating film 705 in an atmosphere containing hydrogen. This is because this hydrogen can be utilized in performing a subsequent step of hydrogenating the semiconductor films. Alternatively, the semiconductor films can be hydrogenated by performing high-density plasma treatment in an atmosphere containing hydrogen while heating the substrate at temperatures from 350 to 450° C. Note that as the atmosphere containing hydrogen, a mixed gas of hydrogen ($H_2$) or ammonia ($NH_3$) and a rare gas (for example, argon (Ar)) can be used. When a mixed gas of ammonia ($NH_3$) and a rare gas (for example, argon (Ar)) is used as the atmosphere containing hydrogen, the surface of the gate insulating film 705 can be nitrided as well as hydrogenated. As a combination example of the mixed gas, 20 to 2000 sccm of hydrogen (or ammonia) and 100 to 10000 sccm of argon may be mixed.

Figure 7A:
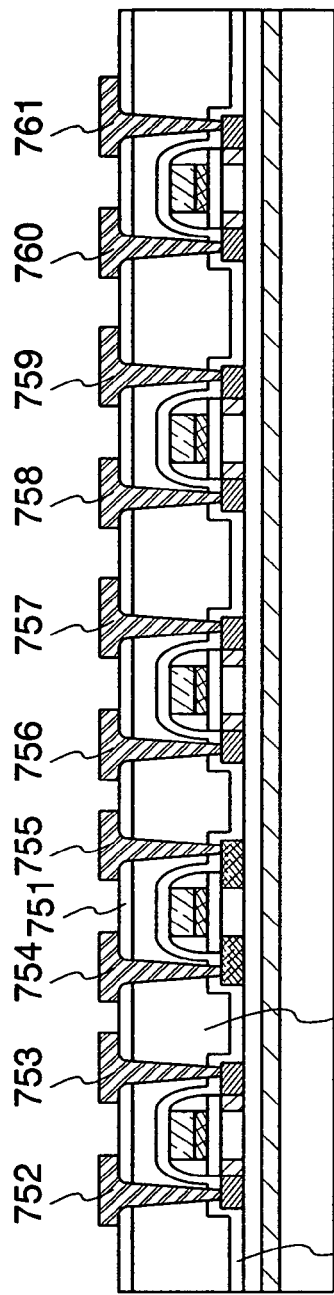
FIGS. 7A and 7B are views each showing a method for manufacturing a semiconductor device according to the present invention (Embodiment Mode 4)

Next, an insulating film is formed in a single layer or a stacked layer so as to cover the thin film transistors 744 to 748 (FIG. 7A). The insulating film that covers the thin film transistors 744 to 748 is formed by a single layer or a stacked layer using an inorganic material such as oxide of silicon or nitride of silicon, an organic material such as polyimide, polyamide, benzocyclobutene, acrylic, epoxy resin, or siloxane, or the like by a known means (an SOG method, a droplet discharging method, or the like). In this specification, siloxane is composed of a skeleton structure formed by the bond of silicon (Si) and oxygen (O), in which an organic group at least containing hydrogen (for example, an alkyl group or aromatic hydrocarbon) is used as a substituent. Alternatively, a fluoro group, or an organic group at least containing hydrogen and a fluoro group may be used as the substituent. For example, in a case where the insulating layer that covers the thin film transistors 744 to 748 has a three-layer structure, a film containing silicon oxide as its main component may be formed as an insulating film 749 in the first layer, a film containing resin as it main component may be formed as an insulating film 750 in the second layer, and a film containing silicon nitride as its main component may be formed as an insulating film 751 in the third layer. In addition, in a case where the insulating layer that covers the thin film transistors 744 to 748 has a single-layer structure, a silicon nitride film or a silicon nitride film containing oxygen may be formed. At this time, preferably, hydrogen may be made to contain in a surface of the silicon nitride film or the silicon nitride film containing oxygen by performing high-density plasma treatment to the silicon nitride film or the silicon nitride film containing oxygen in an atmosphere containing hydrogen. This is because this hydrogen can be utilized in performing a subsequent step of hydrogenating the semiconductor films. Alternatively, the semiconductor films can be hydrogenated by performing high-density plasma treatment in an atmosphere containing hydrogen while heating the substrate at temperatures from 350 to 450° C. Note that as the atmosphere containing hydrogen, a mixed gas of hydrogen ($H_2$) or ammonia ($NH_3$) and a rare gas (for example, argon (Ar)) can be used. When the mixed gas of ammonia ($NH_3$) and a rare gas (for example, argon (Ar)) is used as the atmosphere containing hydrogen, the surface of the gate insulating film 705 can be nitrided as well as hydrogenated.

Note that, before forming the insulating films 749 to 751 or after forming one or a plurality of thin films of the insulating films 749 to 751, heat treatment in order to recover the crystallinity of the semiconductor films, activate the impurity element which has been added into the semiconductor films, or hydrogenate the semiconductor films is preferably performed. As for the heat treatment, a thermal annealing method, a laser annealing method, an RTA method, or the like is preferably adopted. For example, in order to activate the impurity element, thermal annealing at 500° C. or more may be performed. In addition, in order to hydrogenate the semiconductor films, thermal annealing at temperatures from 350 to 450° C. may be performed.

Then, the insulating films 749 to 751 are etched by a photolithography method; therefore, contact holes are formed to expose the N-type impurity regions 726, and 728 to 732 and the P-type impurity region 785. Herein, it is preferable to remove only a nitride film which is formed in a bottom surface of the contact holes by anisotropic etching after nitriding the side walls or bottom surfaces of the contact holes by performing high-density plasma treatment to the contact holes in an atmosphere containing nitrogen. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ may be used. Moisture can be prevented from being absorbed by a TFT through the insulating films 749 to 751 by nitriding the side walls of the contact holes. When a silicon oxide film or an organic material is used as the insulating films 749 to 751, the effect can be particularly expected. This is because an insulating film formed using a silicon oxide film or an organic material is a film originally likely to absorb moisture. In addition, only the nitride film which is formed in the bottom surface of the contact holes is removed by anisotropic etching in order to have preferable contact between a conductive film to be formed subsequently and the N-type impurity regions 726, 728, 730, 732, and the P-type impurity regions 785 (or the silicide region). Subsequently, a conductive film is formed so as to fill the contact holes and patterned to form conductive films 752 to 761 each serving as a source or drain wiring.

The conductive films 752 to 761 are formed using a conductive film containing aluminum (Al) as its main component by a known means (a plasma CVD method or a sputtering method). The conductive film containing aluminum (Al) as its main component corresponds to a material containing nickel whose main component is aluminum or an alloy material containing nickel and one or both of carbon and silicon whose main component is aluminum, for example. A conductive film containing aluminum as its main component generally has difficulty in heat resistance; therefore, it is preferable to have a structure where the upper and lower conductive film containing aluminum as its main component is sandwiched between barrier films. A barrier film corresponds to a film having a function to suppress a hillock of a conductive film containing aluminum as its main component or to increase heat resistance, and chromium, tantalum, tungsten, molybdenum, titanium, silicon, nickel, or nitride thereof can be given as an example to be included in a material having such a function. As an example of a structure of the conductive films 752 to 761, a structure where a titanium film, an aluminum film, and a titanium film are sequentially stacked on the substrate side can be given. A titanium film is an element having a high reducing property; therefore, even when a thin natural oxide film is formed over the crystalline semiconductor film, the natural oxide film is reduced so that preferable contact with the crystalline semiconductor film can be obtained. In addition, by performing high-density plasma treatment to a titanium film formed between the crystalline semiconductor film and the aluminum film in an atmosphere containing nitrogen, the surface is preferably nitrided. As a condition of the high-density plasma treatment, an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ may be used. By nitriding the surface of the titanium film, titanium and aluminum are prevented from being alloyed in a subsequent step of heat treatment or the like, and aluminum can be prevented from being diffused in the crystalline semiconductor film by penetrating the titanium film. Note that, although an example where the aluminum film is sandwiched between the titanium films is explained here, the same thing can be said for a case where a chromium film, a tungsten film, or the like is used instead of the titanium film. In an infinitely preferable manner, film formation of the titanium film, nitriding treatment of the titanium film surface, film formation of the aluminum film, and film formation of the titanium film are performed continuously without being exposed to an atmosphere by using the multi chamber apparatus which is explained in Embodiment Mode 3 and FIG. 4 described above.

Figure 7B:
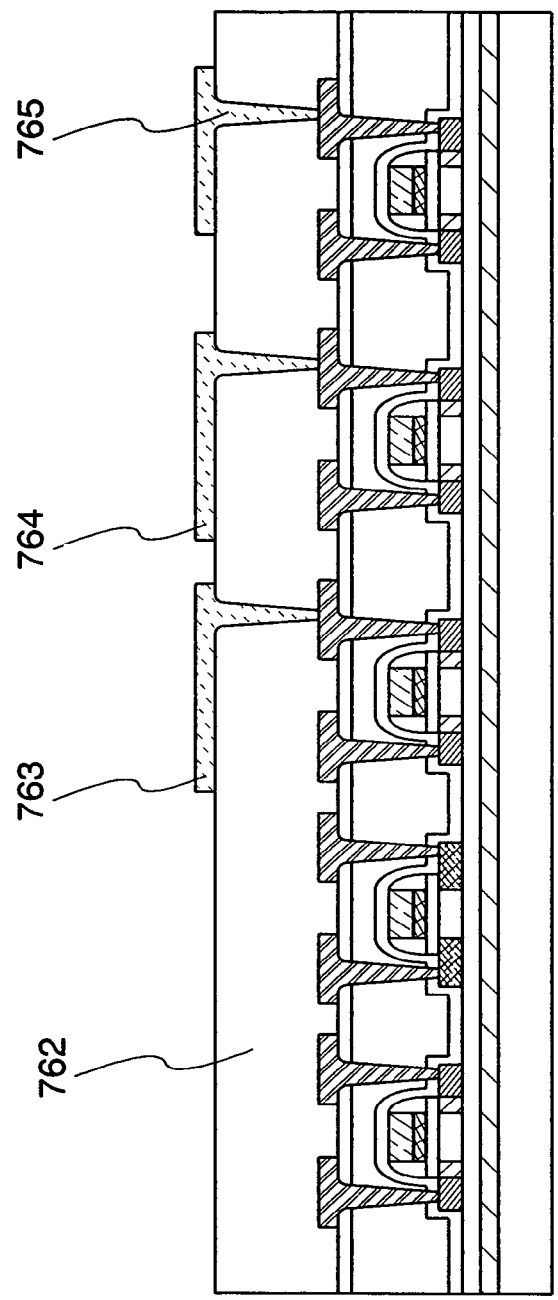

Subsequently, an insulating film 762 is formed so as to cover the conductive films 752 to 761 (FIG. 7B). The insulating film 762 is formed in a single layer or a stacked layer using an inorganic material or an organic material by a known means (an SOG method, a droplet discharging method, or the like). The insulating film 762 is preferably formed to be 0.75 to 3 μm thick.

Next, the insulating film 762 is etched by a photolithography method so that contact holes to expose the conductive films 757, 759, and 761 are formed. Herein, it is preferable to remove only a nitride film which is formed in a bottom surface of the contact holes by anisotropic etching after nitriding the side walls or bottom surfaces of the contact holes by performing high-density plasma treatment to the contact holes in an atmosphere containing nitrogen. As a condition of the high-density plasma treatment, an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ may be used. Moisture can be prevented from being absorbed by a TFT through the insulating film 762 by nitriding the side walls of the contact holes. In addition, only the nitride film which is formed in the bottom surface of the contact holes is removed by anisotropic etching in order to have preferable contact between a conductive film to be formed subsequently and the conductive films 757, 759, and 761. Subsequently, a conductive film is formed so as to fill the contact holes. The conductive film is formed from a conductive material by a known means (a plasma CVD method or a sputtering method). Then, the conductive film is patterned to form conductive films 763 to 765. The conductive films 763 to 765 each serve as an antenna, which is formed from a conductive material by a known means (a plasma CVD method, a sputtering method, a printing method, or a droplet discharging method). The conductive material is formed in a single layer or a stacked layer with one or more elements of aluminum (Al), titanium (Ti), silver (Ag), and copper (Cu), or an alloy material or a compound material containing these elements as its main component. Specifically, the conductive films 763 to 765 are formed using a paste containing silver by a screen printing method, and heat treatment at temperatures from 50 to 350° C. is thereafter performed to form the conducive films. Or, an aluminum film is formed by a sputtering method, and the conductive films are formed by pattern processing the aluminum film. The pattern processing of the aluminum film may be performed by using wet etching processing, and heat treatment at temperatures from 200 to 300° C. may be thereafter performed.

Figure 8:
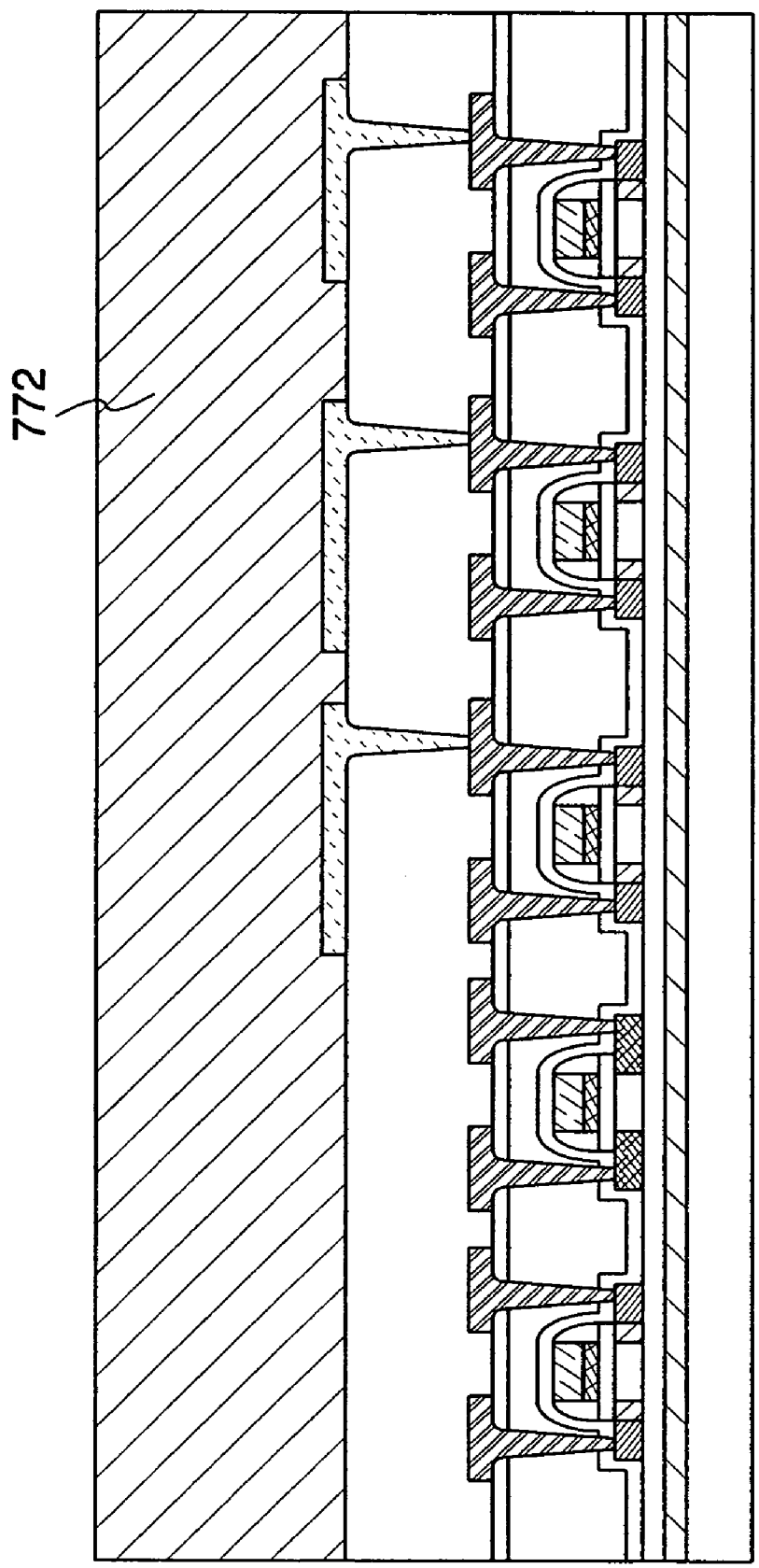
FIG. 8 is a view showing a method for manufacturing a semiconductor device according to the present invention (Embodiment Mode 4)

Then, an insulating film 772 (protective layer) that serves as a protective film to retain a certain degree of strength of an element layer is formed by a known means (an SOG method, a droplet discharging method, or the like) so as to cover the conductive films 763 to 765 that each serve as an antenna (FIG. 8). The insulating film 772 is formed by a film containing carbon such as DLC (Diamond-Like Carbon), a film containing silicon nitride, a film containing silicon nitride oxide, or an organic material and preferably formed of an epoxy resin.

Figures 9A, 9B:
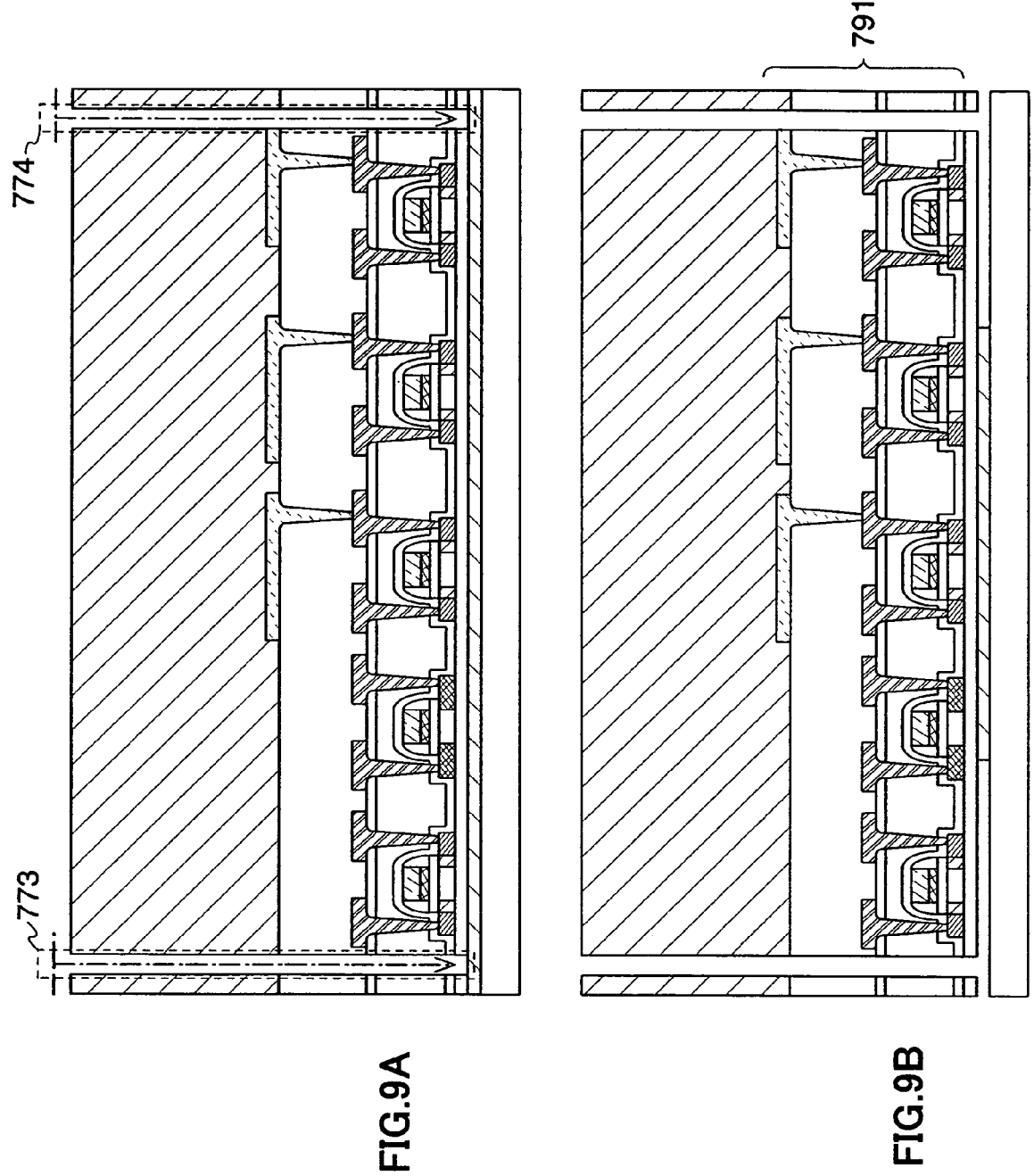
FIGS. 9A and 9B are views each showing a method for manufacturing a semiconductor device according to the present invention (Embodiment Mode 4)

Subsequently, the insulating film is etched by a photolithography method or laser light irradiation to expose the peeling layer 702; therefore, openings 773 and 774 are formed (FIG. 9A).

Next, an etchant is introduced to the openings 773 and 774, if necessary, and the peeling layer 702 is removed (FIG. 9B). As the etchant, a gas or a liquid containing halogen fluoride is used. For example, chlorine trifluoride (ClF$_3$) is used as a gas containing halogen fluoride. Accordingly, an element layer 791 is peeled off the substrate 701. Note that the element layer 791 refers to a layer provided with the thin film transistors 744 to 748 and the conductive films 763 to 765. In addition, part of the peeling layer 702 may be left without being totally removed. By leaving part of the peeling layer 702, consumption of the etchant can be suppressed and processing time can be reduced; thus, cost reduction and high efficiency can be realized. Moreover, the element layer 791 can be held over the substrate 701 even after removing the peeling layer 702.

It is preferable to reuse the substrate 701 after the element layer 791 is peeled off in order to reduce the cost. In addition, the insulating film 722 is formed to prevent the element layer 791 from scattering after the peeling layer 702 is removed. The element layer 791, which is small, thin, and light, scatters easily after the peeling layer 702 is removed because it is not attached firmly to the substrate 701. However, by forming the insulating film 772 over the element layer 791, the element layer 791 is weighted and scattering from the substrate 701 can be prevented. In addition, by forming the insulating film 772, the element layer 791 which is in itself thin and light is not rolled by stress or the like after the substrate 701 is peeled off, and the strength thereof at some degree can be ensured.

Then, one surface of the element layer 791 is attached to a first sheet material 775, and the element layer 791 is completely peeled off the substrate 701 (FIG. 10A). When part of the peeling layer 702 is left without being totally removed, the element layer is peeled off the substrate 701 by a physical means. Subsequently, a second sheet material 776 is provided over the other surface of the element layer 791, and one or both of heat treatment and pressure treatment are performed to attach the second sheet material 776. Simultaneously with or after providing the second sheet material 776, the first sheet member 775 is peeled off and a third sheet material 777 is provided instead. Then, one or both of heat treatment and pressure treatment are performed to attach the third sheet material 777. Accordingly, a semiconductor device which is sealed with the second sheet material 776 and the third sheet material 777 is completed (FIG. 10B).

Note that the sealing may be performed by the first sheet material 775 and the second sheet material 776; however, in a case where a sheet material used for peeling the element layer 791 from the substrate 701 is different from a sheet material used for sealing the element layer 791, the element layer 791 is sealed with the second sheet material 776 and the third sheet material 777 as described above. This is effective, for example, in a case where a sheet material having poor adhesion is required to be used such as a case where the first sheet material 775 may adhere to the substrate 701 not only to the element layer 791 when the element layer 791 is peeled off the substrate 701.

As the second sheet material 776 and the third sheet material 777 used for sealing, a film formed by using polypropylene, polyester, vinyl, polyvinyl fluoride, polyvinyl chloride, or the like, paper of a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like can be used. In order to attach the film, an adhesive layer which is provided in the outermost surface of the film or a layer (not an adhesive layer) which is provided in the outermost layer thereof is melted by heart treatment, and then pressure is applied; therefore, the film is attached. In addition, an adhesive layer may be provided over a surface of the second sheet material 776 or the third sheet material 777, or may not be provided. The adhesive layer corresponds to a layer containing an adhesive such as a heat curable resin, an ultraviolet-curable resin, an epoxy resin-based adhesive, or a resin additive. Moreover, it is preferable to perform silica coating to the sheet material used for sealing in order to prevent moisture or the like from entering inside after the sealing is completed. For example, a sheet material in which an adhesive layer, a film of polyester or the like, and a silica coat are stacked can be used.

Figure 11:
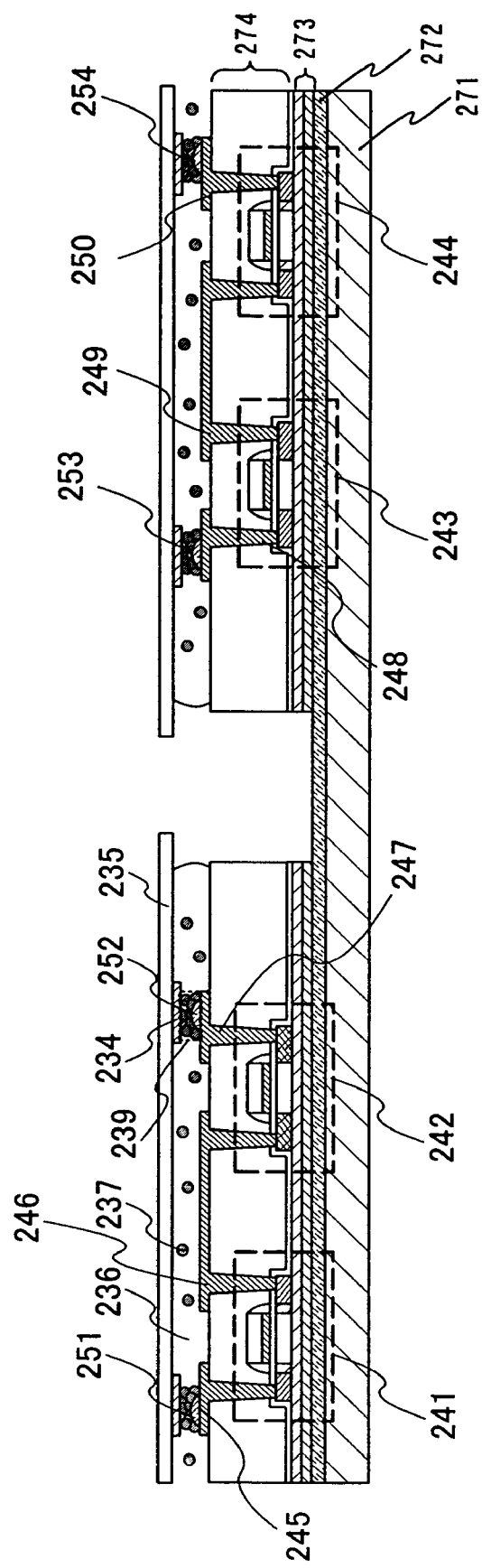
FIG. 11 is a view showing a method for manufacturing a semiconductor device according to the present invention (Embodiment Mode 4)

Although an example of forming an antenna in an element layer is explained in this embodiment mode, as shown in FIG. 11, a structure in which an antenna substrate where an antenna 234 is provided in advance is attached to an element layer 274 with an adhesive or the like without forming an antenna in the element layer may be employed.

In FIG. 11, a peeling layer 272, a base film 273, and the element layer 274 are sequentially stacked over a substrate 271. The element layer 274 is provided with TFTs 241 to 244 and wirings 245 to 250 connected to a source or drain region of each of the TFTs is exposed. In addition, connection terminals 251 to 254 for connecting the antenna 234 are provided over the wirings 245, 247, 248, and 250 of the wirings 245 to 250. In FIG. 11, an anisotropic conductive film 236 in which conductors 237 are dispersed is used as a means for attaching the element layer to the antenna substrate 235. In the anisotropic conductive film 236, the conductors are pressure-bonded in a region 239 in which the connection terminals 251 to 254 and a connection terminal of the antenna are provided due to the thickness of terminals in each of the connection area; therefore, conduction between the connection terminals 251 to 254 and the connection terminal of the antenna 234 can be realized. In the other region, conductors exist with a sufficient interval kept; thus, electrical connection is not made. Instead of a method for attaching with the use of the anisotropic conductive film, the antenna substrate may be attached to the element layer with a method for bonding metals by ultrasound (referred to as an ultrasonic bond), an ultraviolet curing resin, a two-sided tape, or the like.

Next, although not shown, a first sheet material is provided so as to cover the antenna substrate 235. Note that a protective film may be provided so as to cover a top surface of the antenna substrate 235 in order to protect the element layer before providing the first sheet material.

As for a step after providing the first sheet material so as to cover the antenna substrate 235, a method explained with reference to FIGS. 10A and 10B is used; thus, a semiconductor device can be manufactured.

Note that although an example in which the thin film transistors 744 to 748 are each a top-gate type is explained, each may be a bottom-gate type, of course. In addition, although a single-gate structure where one channel-forming region of the thin film transistors 744 to 748 is each formed is explained, a double-gate structure where two channel-forming regions are formed or a triple-gate structure where three channel-forming regions are formed may also be employed. Alternatively, a dual-gate type having two gate electrodes disposed by interposing a gate insulating film between the upper and lower channel-forming regions or another structure may also be employed.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 5

In this embodiment mode, a specific method for manufacturing a memory as a semiconductor device will be explained with reference to drawings. In particular, a structure of an element layer will be explained in detail.

A memory is composed of a memory portion having a thin film transistor and a logic portion having a thin film transistor, and the memory portion and the logic portion are manufactured using the same substrate. Therefore, as for the description of the following explanation in this embodiment mode, the memory portion and the logic portion are to be manufactured through the same steps, if not otherwise specified.

First, an insulating film 1102, a peeling layer 1103, and a base film 1104 are formed over a substrate 1101 as shown in FIG. 12A. As for the forming methods and materials of the substrate 1101, the insulating film 1102, the peeling layer 1103, and the base film 1104, the explanation in Embodiment Mode 1 or Embodiment Mode 2 can be arbitrarily combined; thus, explanation is omitted here. In this embodiment mode, a glass substrate is used as the substrate 1101. In addition, a silicon oxide film containing nitrogen is formed to be 50 to 150 nm thick as the insulating film 1102. Moreover, after forming a tungsten (W) film as the peeling layer 1103, by performing high-density plasma treatment to the tungsten film in an atmosphere containing oxygen, a metal oxide film which is formed over a surface of the metal film is used. As a condition of the high-density plasma treatment, an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing oxygen, a mixed gas of $O_2$ or $N_2O$ and a rare gas, or a mixed gas of $O_2$ or $N_2O$, a rare gas, and hydrogen may be used.

Next, the base film 1104 is formed over the peeling layer 1103 as shown in FIG. 12B. In this embodiment mode, after forming a silicon oxide film as the base film 1104, by performing high-density plasma treatment to the silicon oxide film in an atmosphere containing nitrogen, a structure where the silicon oxide film the surface of which is nitrided and a silicon oxide film containing nitrogen are stacked is obtained. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing nitrogen, a mixed gas of $N_2$ or $NH_3$ and a rare gas, or a mixed gas of $N_2$ or $NH_3$, a rare gas, and $H_2$ may be used. Generally, a silicon oxide film, which is formed by a CVD method or a sputtering method, has a defect therein; thus, the film quality is not sufficient. In this embodiment mode, a dense film can be formed by performing high-density plasma treatment to the silicon oxide film in an atmosphere containing nitrogen to be nitrided. Consequently, in a case of providing a semiconductor element over the base film 1104, mixture of an impurity element from the substrate 1101 or the peeling layer 1103 can be prevented.

Then, an element layer is formed. First, after forming an amorphous silicon film to be 40 to 300 nm thick, crystallization is performed and then a polysilicon film 1105 is formed. As for a crystallization method, the method explained in Embodiment Mode 4 may be used, and the amorphous silicon film is irradiated with continuous-wave laser light to be crystallized in this embodiment mode.

Subsequently, the polysilicon film 1105 is doped with impurities imparting P-type conductivity. In this embodiment mode, boron (B) is doped (FIG. 12C).

Next, first to fourth island-shaped polysilicon films 1106 to 1109 are formed by patterning the polysilicon film 1105 (FIG. 12D). The first and second island-shaped polysilicon films 1106 and 1107 are used for the memory portion, and the third and fourth island-shaped polysilicon films 1108 and 1109 are used for the logic portion.

Then, after forming a resist mask 1110 so as to cover the fourth island-shaped polysilicon film 1109, the first to third island-shaped polysilicon films 1106 to 1108 are doped with impurities imparting P-type conductivity (FIG. 13A). In this embodiment mode, boron (B) is doped.

Next, the resist mask 1110 formed by covering the first island-shaped polysilicon film 1109 is removed. Subsequently, high-density plasma treatment is performed to the first to fourth island-shaped polysilicon films 1106 to 1109 in an atmosphere containing oxygen. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing oxygen, a mixed gas of $O_2$ or $N_2O$ and a rare gas, or a mixed gas of $O_2$ or $N_2O$, a rare gas, and hydrogen may be used. According to this high-density plasma treatment, an oxide film 1121 is formed over each surface (a top surface and a side surface) of the first to fourth island-shaped polysilicon films 1106 to 1109 (FIG. 13B). The oxide film 1121 may be formed to be 2 to 10 nm thick. Note that, in this embodiment mode, although high-density plasma treatment is performed in an atmosphere containing oxygen, a silicon oxide film containing nitrogen ($SiO_xN_y$) (x>y) (x and y are positive integers) may also be formed by performing high-density plasma treatment in an atmosphere containing oxygen and nitrogen. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing oxygen and nitrogen, a mixed gas of $N_2$ or $NH_3$, $O_2$, and a rare gas may be used. As an example of the combination of the mixed gas, 20 to 1000 sccm of nitrogen (or ammonia), 10 to 500 sccm of oxygen, and 100 to 5000 sccm of argon may be contained, and it is preferable to introduce the mixed gas in the ratio of nitrogen (or ammonia):oxygen:argon to be 2:1:10.

Generally, a silicon oxide film or a silicon oxide film containing nitrogen, which is formed by a CVD method or a sputtering method, has a defect therein; thus, the film quality is not sufficient. By performing plasma treatment to a semiconductor film in an atmosphere containing oxygen to be oxidized, a dense insulating film can be formed by an insulating film formed over the semiconductor film by a CVD method or a sputtering method. In addition, in a case of providing a conductive film by interposing the insulating film provided using a CVD method or a sputtering method over the semiconductor film, there is fear that poor coating such as disconnection of the insulating film is generated at the end portion of the semiconductor film and short or the like is generated between the semiconductor film and the conductive film. However, the coating failure of the insulating film at the end portion of the semiconductor film can be prevented by oxidizing a surface of the semiconductor film in advance by using plasma treatment. In addition, the insulating film formed in the memory portion has few insulating leak; thus, a retention characteristic of the memory portion is improved.

Then, a silicon nitride film 1122 is formed over the oxide film 1121 and the base film 1104 to be 4 to 20 nm thick (FIG. 13C). Subsequently, high-density plasma treatment is performed to the silicon nitride film 1122 in an atmosphere containing oxygen. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing oxygen, a mixed gas of $O_2$ or $N_2O$ and a rare gas, or a mixed gas of $O_2$ or $N_2O$, a rare gas, and hydrogen may be used. According to this high-density plasma treatment, a silicon nitride film containing oxygen 1123 is formed over a surface (a top surface and a side surface) of the silicon nitride film 1122 (FIG. 13D). The silicon nitride film containing oxygen 1123 may be formed to be 2 to 10 nm thick.

Subsequently, after selectively forming a resist mask 1124 only to the memory portion as shown in FIG. 14A, only the logic portion is selectively oxidized. Specifically, high-density plasma treatment in an atmosphere containing oxygen is performed to the silicon nitride film 1122 and the silicon nitride film containing oxygen 1123 in the logic portion. As a condition of the high-density plasma treatment, an electron density of plasma is $1\times10^{11}$ cm$^{-3}$ or more and $1\times10^{13}$ cm$^{-3}$ or less, and an electron temperature of plasma is 0.5 eV or more and 1.5 eV or less. As the atmosphere containing oxygen, a mixed gas of $O_2$ or $N_2O$ and a rare gas, or a mixed gas of $O_2$ or $N_2O$, a rare gas, and hydrogen may be used. According to this high-density plasma treatment, the silicon nitride film 1122 and the silicon nitride film containing oxygen 1123 in the logic portion are oxidized; thus, an oxide film 1125 is formed.

Next, the resist mask 1124 formed in the memory portion is removed. Subsequently, after forming first and second conductive films over the silicon nitride film containing oxygen 1123 and the oxide film 1125, these conductive films are patterned (FIG. 14B). Patterned first conductive films 1126a to 1129a and second conductive films 1126b to 1129b are each formed over the first to fourth island-shaped polysilicon films 1106 to 1109, which each serve as a gate electrode. In this embodiment mode, although a structure where tantalum nitride and tungsten are sequentially stacked on the substrate side is employed as the conductive films, the conductive film is not limited to this structure and a single layer structure may also be employed. In addition, the material is not limited thereto, and one or more elements of tantalum (Ta), tungsten (W), titanium (Ti), molybdenum (Mo), aluminum (Al), copper (Cu), chromium (Cr), niobium (Nb), and the like, or an alloy material or a compound material containing these elements as its main component can be used to form the conductive film. Moreover, the conductive film can also be formed from a semiconductor material typified by polycrystalline silicon doped with an impurity element such as phosphorus.

Note that, as for a method for selectively oxidizing the logic portion, a method besides the above method for forming the resist mask 1124 over a top surface of the silicon nitride film containing oxygen 1123 formed in the memory portion may also be used. For example, as shown in FIG. 15A, there is a method for forming a conductive film 1160 over a top surface of the silicon nitride film containing oxygen 1123 formed in the memory portion. By selectively forming the conductive film 1160 only in the memory portion, the oxide film 1125 can be formed by selectively oxidizing the logic portion (FIG. 15B). In a case of using this method, the first and second conductive films may be stacked and patterned without removing the conductive film. Therefore, the patterned conductive films formed in the memory portion has a three-layer structure (FIG. 15C).

Then, after forming the conductive films 1126 to 1129 that each serve as a gate electrode, a resist mask is selectively formed over a region where the first island-shaped polysilicon film 1106 is formed and then the first to third island-shaped polysilicon films 1106 to 1108 are doped with impurities imparting an N-type conductivity. In this embodiment mode, phosphorus (P) is doped. In addition, after selectively forming a resist mask over a region where the first to third island-shaped polysilicon films 1106 to 1108 are formed, the fourth island-shaped polysilicon film 1109 is doped with impurities imparting P-type conductivity. In this embodiment mode, boron (B) is doped. Accordingly, memory elements 1131 and 1132 (memory) using the first and second island-shaped polysilicon films 1106 and 1107, an N-channel thin film transistor 1133 where the third island-shaped polysilicon film 1108 serves as an active layer, and a P-channel thin film transistor 1134 where the fourth island-shaped polysilicon film 1109 serves as an active layer are completed (FIG. 14C).

The methods explained in Embodiment Mode 4 can be used in the subsequent steps. In other words, after forming an antenna and forming an element layer, a protective layer is formed over the element layer. Subsequently, a semiconductor device is completed by sealing the base film, the element layer, and the protective layer with the use of first and second sheet materials.

Note that although an example of using a top-gate type as a thin film transistor provided in the logic portion is explained in this embodiment mode, a bottom-gate thin film transistor can also be used. In addition, a single-gate structure where one channel-forming region of thin film transistors is each formed is explained, a double-gate structure where two channel-forming regions are formed or a triple-gate structure where three channel-forming regions are formed may also be employed. Alternatively, a dual-gate structure where a gate insulating film is interposed between upper and lower channel-forming regions or other structure may also be employed.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 6

In this embodiment mode, another manufacturing method different from the method for manufacturing a memory explained in Embodiment Modes 5 and 6 will be explained with reference to drawings.

First, a manufacturing process up to a state shown in FIG. 13B is performed as explained in Embodiment Mode 5.

Next, dispersed conductive particles or semiconductor particles (hereinafter, referred to as dispersed particles) 1141 is formed over an oxide film 1121 and a base film 1104 (FIG. 16A). As for a method for manufacturing the dispersed particles 1141, a known method such as a sputtering method, a plasma CVD method, a low-pressure CVD (LPCVD) method, a vapor-deposition method, or a droplet discharging method can be used. The size of the dispersed particles is 0.1 to 10 nm, preferably 2 to 5 nm. In addition, as the material of the conductive particles, gold, silver, copper, palladium, platinum, cobalt, tungsten, nickel, or the like can be used. As for the material of the semiconductor particles, silicon (Si), germanium (Ge), a silicon-germanium alloy, or the like can be used. Herein, silicon microcrystal is formed as the dispersed particles 1141. Note that a crystalline semiconductor film can also be used instead of the dispersed particles.

Then, a silicon oxide film containing nitrogen 1142 is formed over the dispersed particles 1141 to be 2 to 10 nm thick (FIG. 16B). Subsequently, after selectively forming a resist mask 1143 only to a memory portion as shown in FIG. 16C, only a logic portion is selectively oxidized. Specifically, high-density plasma treatment in an atmosphere containing oxygen is performed to the dispersed particles 1141 and the silicon oxide film containing nitrogen 1142 of the logic portion. As a condition of the high-density plasma treatment, an electron density of plasma is $1 \times 10^{11}$ cm$^{-3}$ or more and $1 \times 10^{13}$ cm$^{-3}$ or less, and an electron temperature of plasma is 0.5 eV or more and 1.5 eV or less. As the atmosphere containing oxygen, a mixed gas of $O_2$ or $N_2O$ and a rare gas, or a mixed gas of $O_2$ or $N_2O$, a rare gas, and hydrogen may be used. According to this high-density plasma treatment, the dispersed particles 1141 and the silicon oxide film containing nitrogen 1142 of the logic portion are oxidized; thus, an oxide film 1144 is formed (FIG. 16D).

As for the subsequent steps, the steps explained in Embodiment Mode 5 can be used.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 7

In this embodiment mode, another manufacturing method different from the method for manufacturing a memory explained in Embodiment Mode 5 will be explained with reference to drawings.

First, a manufacturing process up to a state shown in FIG. 13A is performed as explained in Embodiment Mode 5.

Subsequently, a resist mask 1110, which is formed to cover a first island-shaped polysilicon film 1106, is removed (FIG. 23A).

Next, by performing high-density plasma treatment to first to fourth island-shaped polysilicon films 1106 to 1109 in an atmosphere containing oxygen, an oxide film 1161 is formed over a surface (a top surface and a side surface) of the first to fourth island-shaped polysilicon films 1106 to 1109 (FIG. 23B). The oxide film 1161 is formed to be 2 to 10 nm thick. In addition, the oxide film 1161 in a memory portion serves as a tunnel insulating film. Further, by performing high-density plasma treatment to the oxide film 1161 in an atmosphere containing nitrogen, it is preferable to nitride a surface (a top surface and a side surface) of the oxide film 1161 (FIG. 23C). A film 1162 is formed to be 1 to 5 nm thick over the surface of the oxide film 1161 by nitriding. Note that, as for a condition of the high-density plasma treatment, the condition described in the above embodiment mode may be used.

Then, a silicon nitride film 1122 is formed to be 4 to 20 nm thick over the oxide film 1161 (or an oxide film the surface of which is nitrided) (FIG. 23D). It is preferable to form the silicon nitride film 1122 by a plasma CVD method. In addition, the silicon nitride film 1122 in the memory portion serves as an insulating film that traps (captures) an electric charge.

Subsequently, a silicon oxide film containing nitrogen 1123 is formed over the silicon nitride film 1122 (FIG. 23E). It is preferable to form the silicon oxide film containing nitrogen 1123 by a plasma CVD method. Far preferably, after forming the silicon nitride film 1122 by a plasma CVD method, the silicon oxide film containing nitrogen 1123 may be formed continuously by a plasma CVD method without being exposed to an atmosphere.

The memory portion and a logic portion can be completed by following the steps subsequent to FIG. 14A explained in Embodiment Mode 5 as for the subsequent steps.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 8

In this embodiment mode, another manufacturing method for forming the oxide film 1161 explained in Embodiment Mode 7 will be explained.

First, a manufacturing process up to a state shown in FIG. 13A is performed as explained in Embodiment Mode 5. Subsequently, a resist mask 1110, which is formed to cover a first island-shaped polysilicon film 1106, is removed.

Next, by performing high-density plasma treatment to first to fourth island-shaped polysilicon films 1106 to 1109 in an atmosphere containing oxygen and nitrogen, a silicon oxide film containing nitrogen is formed over a surface (a top surface and a side surface) of the first to fourth island-shaped polysilicon films 1106 to 1109. The silicon oxide film containing nitrogen is formed to be 2 to 10 nm thick. The silicon oxide film containing nitrogen in a memory portion serves as a tunnel insulating film. Note that, as for a condition of the high-density plasma treatment, the condition described in the above embodiment mode may be used.

The memory portion and a logic portion can be completed by following the steps subsequent to FIG. 13C explained in Embodiment Modes 5 to 7 as for the subsequent steps.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 9

In this embodiment mode, a method for manufacturing a display device having a light-emitting element as a semiconductor device will be explained with reference to drawings.

First, a peeling layer 201, a first insulating film 202, a second insulating film 203, a semiconductor film 204, a gate insulating film 205, a gate electrode 206, an interlayer insulating film 207, source or drain electrodes 208 and 209, a pixel electrode 210, a wiring 211, and an insulating film 212 formed to cover the end portion of the pixel electrode (also referred to as a partition layer or an embankment) are provided over a substrate 200 as shown in FIG. 17A. Hereinafter, a structure of FIG. 17A will be explained in detail.

First, the peeling layer 201 and a base film are formed over the substrate 200 (FIG. 17A). As for the forming methods and materials of the substrate 200, the peeling layer 201, and the base film, those explained in Embodiment Mode 1 or Embodiment Mode 2 can be arbitrarily combined; thus, explanation is omitted here. In this embodiment mode, a stacked structure composed of the first insulating film 202 and the second insulating film 203 is employed as the base film.

Next, an element layer is formed over the base film. A thin film transistor is provided in the element layer, and the thin film transistor has the semiconductor film 204 patterned in a desired shape, the gate insulating film 205, and the gate electrode 206.

The semiconductor film 204 may have any one of states of an amorphous semiconductor, a semi-amorphous silicon (SAS) where an amorphous state and a crystalline state are mixed, a microcrystalline semiconductor where crystal grains of 0.5 to 20 nm can be observed in an amorphous semiconductor, and a crystalline semiconductor.

In this embodiment mode, an amorphous semiconductor film is formed, and a crystalline semiconductor film that is crystallized by heat treatment is formed. As for the heat treatment, a heating furnace, laser irradiation, irradiation of light emitted from a lamp instead of laser light (lamp annealing), or the combination thereof can be used.

The gate insulating film 205 is formed so as to cover the semiconductor film 204. The gate insulating film 205 can be formed in a single layer or a stacked layer of a plurality of films by using silicon oxide, silicon nitride, silicon nitride oxide, or the like, for example. A plasma CVD method, a sputtering method, or the like can be used for the film forming method.

The gate electrode 206 is formed over the gate insulating film 205. The gate electrode 206 can be formed using one or more elements of Ta, W, Ti, Mo, Al, Cu, Cr, and Nb, or an alloy material or a compound material containing the elements as its main component, for example. In addition, a semiconductor film typified by a polycrystalline silicon film doped with an impurity element such as phosphorus may also be used. Moreover, an AgPdCu alloy may also be used. Further, the combination may be appropriately selected. Furthermore, the gate electrode 206 may be formed in a single layer structure or a stacked layer structure of a plurality of layers.

Subsequently, the semiconductor film 204 is selectively added with impurities imparting N-type or P-type conductivity by forming and patterning a gate electrode or a resist to be used as a mask. The semiconductor film 204 has a channel-forming region and an impurity region (including a source region, a drain region, a GOLD region, and an LDD region) and can selectively form an N-channel TFT or a P-channel TFT depending on conductivity of an impurity element to be added. In addition, a sidewall may also be formed on the side of the gate electrode 206.

Next, the interlayer insulating film 207 is formed. As the interlayer insulating film 207, an inorganic insulating film or an organic insulating film can be used. As the inorganic insulating film, a silicon oxide film or a silicon oxide film containing nitrogen formed by a CVD method, a silicon oxide film coated by an SOG (Spin On Glass) method, or the like can be used. As the organic insulating film, a film of polyimide, polyamide, BCB (benzocyclobutene), acrylic, siloxane, positive-type photosensitive organic resin, negative-type photosensitive organic resin, or the like can be used. In addition, a stacked structure of an acrylic film and a silicon oxide film containing nitrogen may also be employed.

In this embodiment mode, siloxane is used. By using siloxane, an interlayer insulating film having adequate insulation and planarity can be obtained even when the film thickness is reduced. In addition, since siloxane has high heat resistance, an interlayer insulating film that can withstand reflow treatment in a multilayer wiring can be obtained. Further, since hygroscopicity is low, an interlayer insulating film with few dehydration amounts can be formed.

Then, the interlayer insulating film 207 is etched to form contact holes that reach source and drain regions of the semiconductor film 204. Subsequently, the source or drain electrodes 208 and 209, and the wiring 211 that are electrically connected to each of the source and drain regions are formed. As the source or drain electrodes 208 and 209, and the wiring 211, one kind of elements of Al, Ni, C, W, Mo, Ti, Pt, Cu, Ta, Au, and Mn, or a single layer or stacked layer structure composed of alloy containing a plurality of the elements can be used. For example, a stacked layer film of a Ti film and an alloy film containing Al and Ti can be formed by being patterned. Of course, the stacked film is not limited to a three-layer structure, and any one of a single-layer structure, a two-layer structure, or a stacked layer structure of three or more may be employed.

Subsequently, the pixel electrode 210 is formed over the interlayer insulating film 207. The pixel electrode 210 is formed so as to be electrically connected to the source or drain electrode 208. Note that although the pixel electrode 210 is formed after forming the source or drain electrode 208, the source or drain electrode 208 may be formed after forming the pixel electrode 210 first.

When the pixel electrode 210 is used as an anode, it is preferable to use a material having a high work function. For example, in addition to a single-layer film such as an ITO (indium tin oxide) film, an IZO (indium zinc oxide) film, a titanium nitride film, a chromium film, a tungsten film, a Zn film, or a Pt film, a stacked layer of a titanium nitride film and a film containing aluminum as its main component, a three-layer structure of a titanium nitride film, a film containing aluminum as it main component, and a titanium nitride film, or the like can be used. Note that, when a stacked-layer structure is employed, a wiring has low resistance and preferable ohmic contact can be obtained, which can further serve as an anode.

On the other hand, when the pixel electrode 210 is used as a cathode, it is preferable to use a material having a low work function. For example, it is possible to use Al, Ag, Li, Ca, an alloy thereof, that is, MgAg, MgIn, Al—Li, CaF$_2$, or calcium nitride. Note that when it is desired to transmit light through the pixel electrode 210, it is preferable to employ a stacked-layer structure of a metal thin film the film thickness of which is reduced and a transparent conductive film (ITO (indium tin oxide), indium zinc oxide (In$_2$O$_3$—ZnO), zinc oxide (ZnO), or the like).

Next, the insulating film 212 is selectively formed so as to cover the source or drain electrodes 208 and 209, the wiring 211, and the end portion of the pixel electrode 210. The insulating film 212 may also be referred to as a partition layer or an embankment, which can be formed using an organic material such as acrylic, polyimide, or the like, an inorganic material such as silicon oxide, silicon oxynitride, or a siloxane-base material, or the like. In addition, the insulating film 212 may be formed in a shape that a curvature radius changes continuously or a tapered shape so that disconnection of a light-emitting layer that will be subsequently formed to cover the pixel electrode 210 does not occur.

Through the above steps, a structure shown in FIG. 17A can be obtained.

Next, an opening 213 for subsequently introducing an etchant is selectively formed not to reach a thin film transistor and a forming portion of a wiring (FIG. 17B). The opening 213 is formed so that the peeling layer 201 is exposed by removing the first insulating film 202, the second insulating film 203, the gate insulating film 205, the interlayer insulating film 207, and the insulating film 212.

Subsequently, the peeling layer 201 is removed by introducing the etchant to the opening 213, if necessary. In this embodiment mode, the peeling layer is chemically reacted with the etchant to remove the peeling layer 201. The peeling layer 201 may be removed completely but the peeling layer 201 is not removed completely here so that at least part of the peeling layer that is placed below the pixel electrode 210 is left without removing the peeling layer 201 completely (FIG. 17C). The amount of the etchant to be left can be controlled by setting an etching flow rate and a reactive time in consideration of the reaction of the peeling layer and the etchant. An element forming portion 215 constituting a display device 215 (hereinafter, referred to as an element forming portion 215) is not completely separated from the substrate 200 by leaving part of the peeling layer 201 even after removing the peeling layer 201; thus, it is possible to prevent the element forming portion 215 from being parted.

As the etchant, a gas or a liquid containing halogen fluoride that easily react with the peeling layer can be used. For example, chlorine trifluoride (ClF$_3$) that react well with tungsten (W) is preferably used when a W film is used as the peeling layer 201. In addition, besides, CF$_4$, SF$_6$, NF$_3$, F$_2$, or the like may also be used as the etchant, which may be appropriately selected by a practitioner.

Then, a first sheet material 214 is attached to the insulating film 212 from an opposite side of the substrate 200 to peel the element forming portion 215 provided over the substrate 200 off the substrate 200 through the peeling layer 201 (FIG. 17D). The first sheet material 214 is made of a flexible film and at least a surface in contact with the element forming portion 215 is provided with an adhesive. For example, it is possible to use a film in which an adhesive having poor adhesion containing acrylic resin or the like is provided over a base film made of polyester or the like.

Next, a surface opposite to the surface to which the first sheet material 214 of the element forming portion 215 is attached is attached to a second sheet material 216 and then the element forming portion 215 is peeled off the first sheet material 214 (FIG. 18A).

Then, a light-emitting layer 217 is selectively formed over the pixel electrode 210 (FIG. 18B). The light-emitting layer 217 may be selectively formed by using a droplet discharging method or may be formed using a screen printing method or a gravure printing method. Alternatively, a vapor deposition method using a vapor-deposition mask may also be used. In this embodiment mode, the light-emitting layer 217 is selectively formed by using a droplet discharging method. In addition, in a case of forming a display device capable of color display, a method for selectively forming each of light-emitting layers that emits light of three color of R, G, and B may be used. By forming the light-emitting layer with the use of a droplet discharging method or a printing method in this manner, a waste material can be reduced; thus, the cost can be reduced.

As a material for forming the light-emitting layer 217, a single layer or stacked layer structure may be employed by using an organic compound of a low molecular material, a middle molecular material (containing oligomer and dendrimer), a high molecular material, or the like. In addition, as the material for forming the light-emitting layer 217, it is possible to use an inorganic compound besides the organic compound. Generally, whether a light-emitting material used for a light-emitting layer is an organic compound or an inorganic compound determines that the former is referred to as an organic EL element and the latter is referred to as an inorganic EL element and either compound may be applied in this embodiment mode.

The inorganic EL element is classified into a dispersed inorganic EL element and a thin film inorganic EL element depending on its element structure. The difference is that the former has a light-emitting layer where particles of light-emitting material are dispersed in a binder, and the latter has a light-emitting layer made of a thin film of a fluorescent material. However, the both have mechanism in common and light emission can be obtained by a core material of an electron that is accelerated by a high electric field or by collided excitation at a light-emission center. In this embodiment mode, when the inorganic EL element is provided, either the dispersed inorganic EL element or the thin film inorganic EL element may be applied.

In addition, where there is a problem in respect of intensity, an insulating film or the like may be formed in the opening 213 before forming the light-emitting layer 217. In this case, the insulating film can be selectively formed using a droplet discharging method.

Moreover, as an emission method of light emitted through a light-emitting element, there are a top emission by which light is emitted to a substrate side, a bottom emission by which light is emitted to the opposite side, and dual emission by which light is emitted to both of a substrate side and the opposite side by forming a pair of electrodes with a transparent material or in a thickness thin enough to transmit light, and any one of emission type may be applied. In addition, the light-emitting layer 217 may be any one of a single-layer type, a stacked-layer type, and mixed type without an interface of layers. Further, the light-emitting layer 217 may be formed using any one of a singlet material, a triplet material, and a combined material thereof. Furthermore, any one of an organic material including a low molecular material, a high molecular material, and a middle molecular material, an inorganic material typified by molybdenum oxide or the like superior in an electron-injecting property, and a compound material of the organic material and the inorganic material may also be used.

Thereafter, an opposite electrode 218 is formed (FIG. 18B). The opposite electrode 218 can also be selectively formed by discharging a composition containing a conductor with the use of a droplet discharging method. In addition, as the material of the opposite electrode 218, any one of materials shown in the above material of the pixel electrode 210 can be used depending on whether the material is used as an anode or a cathode.

Next, as well as a third sheet material 220 is attached to a surface of the element forming portion 215 opposite to the surface attached to the second sheet material 216, the element forming portion 220 is sealed by the second sheet material 216 and the third sheet material 220 (FIG. 18C). The element forming portion 215 is in a state sealed by the second sheet material 216 and the third sheet material 220. Note that a protective film 219 may be formed in advance before sealing when the water resistance or the like of the light-emitting layer is concerned. The protective film 219 is formed not to have the light-emitting layer in contact with outside air or moisture. Therefore, as the protective film 219, a resin material such as an epoxy resin, an acrylic resin, a phenol resin, a novolac resin, a melamine resin, or a urethane resin, a resin containing a fluorine atom as a liquid-repellent material, a resin composed only of hydrocarbon, or the like can be used. More in detail, a resin containing a monomer including a fluorine atom in its molecule or a resin containing a monomer all composed only of carbon and a hydrogen molecule can be given as an example. Besides, an organic material such as acrylic, benzocyclobutene, parylene, allylene ether fluoride, or polyimide having transmissivity, a compound material formed by polymerization of a siloxane-based polymer or the like, a composition containing a water-soluble polymer and a water-soluble copolymer, or the like can be used. Alternatively, an inorganic material may also be used.

In addition, the second sheet material 216 and the third sheet material 220 are each a flexible film and a stacked film can be used, for example. More specifically, a hot metal film formed over a base film such as polyester can be used. When the second sheet material 216 and the third sheet material 220 are attached to the element forming portion 215, one or both of pressure treatment and heat treatment are performed so that the attachment can be performed in a short time. In addition, the opposite electrode can be formed as well in sealing the element forming portion 215 by providing the opposite electrode over a surface of the third sheet material.

Note that, in this embodiment mode, the peeled substrate 200 can be reused. Consequently, since the same substrate can be used repeatedly in manufacturing a display device using the substrate, low cost can be realized even in a case of using a quartz substrate the cost of which is higher than a glass substrate. Note that, in the case of reusing the substrate, it is desirable to control so as not to damage the substrate in the peeling step. However, even when the substrate is damaged, an organic resin film or an inorganic resin film may be formed by a coating method or a droplet discharging method, or planarizing treatment may be performed by grinding or polishing.

Through the above steps, a display device in a flexible film state is completed. Note that although an example regarding an EL display device using an electroluminescent layer is shown in this embodiment mode, without limitation thereto, the present invention can also be applied in the same manner to a liquid crystal display device or other display device using a self-luminous element.

The case where the above steps are applied to a liquid crystal display device is shown in FIGS. 19A to 19C. First, as described above, an element forming portion 230 constituting part of the liquid crystal display device is formed over a substrate (for example, a glass substrate) having rigidity, and thereafter, a first sheet material 214 is attached to one of surfaces of the element forming portion 230 to peel the element forming portion 230 off the substrate. Note that, in this embodiment mode, an alignment film 281 is formed to cover a pixel electrode in forming the element forming portion over the substrate. Next, a second sheet material 216 is attached to the other surface of the element forming portion 230 to peel the element forming portion 230 off the first sheet material 214 (FIG. 19A). Thereafter, a liquid crystal layer and an opposite electrode are formed in the element forming portion 230 by processing means. The liquid crystal layer may be formed by a known method, for example, a droplet discharging method (FIG. 19B). Subsequently, a third sheet material 220 is attached over a liquid crystal layer 219 and an opposite electrode 229 that are formed over the element forming portion 230 to seal the second sheet material 216 and the third sheet material 220; thus, the liquid crystal display device can be formed (FIG. 19C). The liquid crystal layer is formed between the alignment film 281 and an alignment film 282, and display can be performed by providing a polarizing plate above and under the liquid crystal display device.

Since an opening 283 is formed between pixels in the display device in a flexible film state that is manufactured by using this embodiment mode, the completed display device in a flexible film state becomes flexible. In other words, the display device has a merit that the pressure applied to a pixel decreases when being bended by providing the opening 283.

Note that although explanation is given with a specific example regarding a top gate thin film transistor in this embodiment mode, a bottom gate transistor may also be used. In addition, although an example regarding an active matrix type is explained, a passive matrix structure may also be employed. Moreover, although explanation regarding a pixel region is given, a driver circuit for driving a pixel portion may be formed over the substrate in the same manner to provide over a flexible substrate by being peeled off simultaneously with the pixel region. A wiring to connect the pixel region and the driver circuit may be formed before peeling or may be formed by processing means after being provided over the flexible substrate after peeling. Alternatively, a circuit and the like to control the driver circuit and the pixel region may be formed over another substrate and may be peeled off the substrate to each provide over the flexible substrate, and a wiring to electrically connect each thereof may be formed thereafter. In this case, each structure can be obtained depending on a substrate; thus, a display device can be formed efficiently.

This embodiment mode can be implemented by arbitrarily combining with the above embodiment modes. In other words, the materials and the forming methods described in the above embodiment modes can be used in this embodiment mode while the materials and the forming methods described in this embodiment mode can be used in the above embodiment modes.

Embodiment Mode 10

In this embodiment mode, one embodiment mode of a case where a semiconductor device according to the present invention is used as an RFID tag which is capable of transmitting and receiving data without contact will be explained with reference to FIGS. 20A to 20C.

Figure 20A:
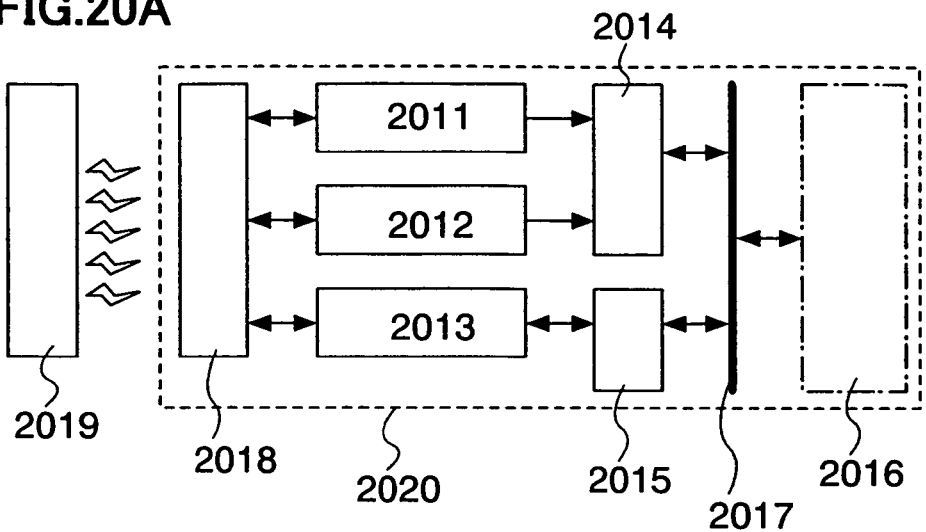
FIGS. 20A to 20C are a diagram and views each explaining a usage pattern of a semiconductor device according to the present invention (Embodiment Mode 10)
Figure 20B:
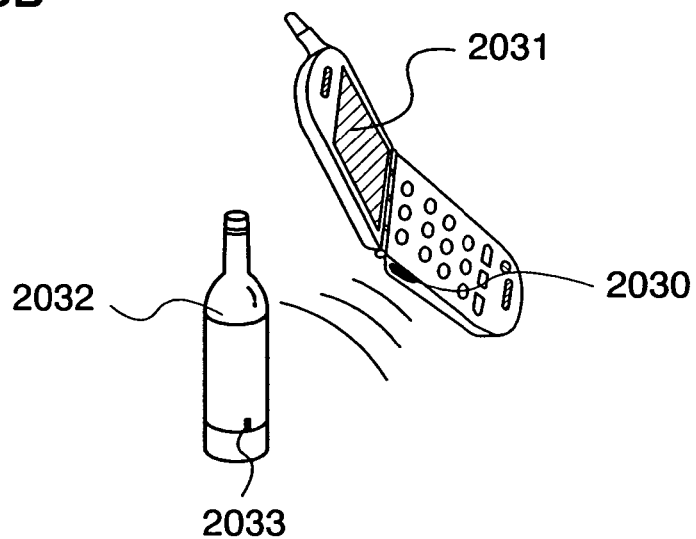
Figure 20C:
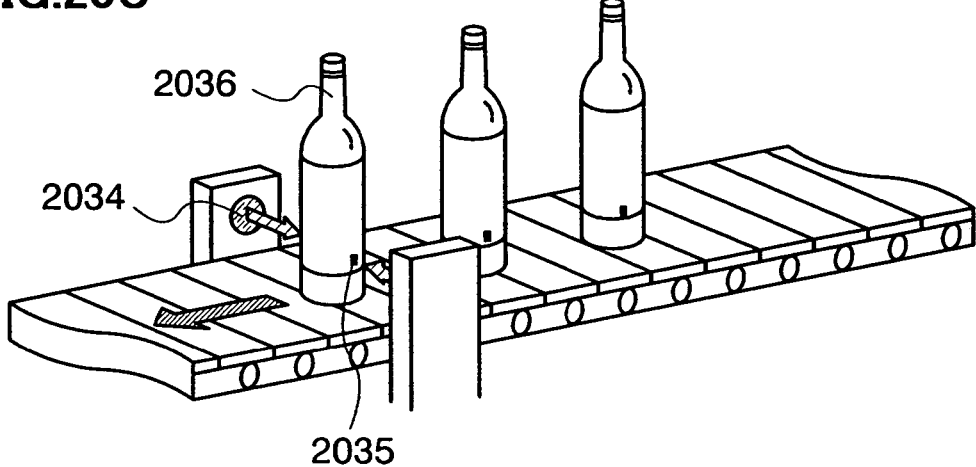

An RFID tag 2020 has a function of communicating data without contact, which includes a power source circuit 2011, a clock generating circuit 2012, a data demodulation/modulation circuit 2013, a control circuit 2014 for controlling other circuit, an interface circuit 2015, a memory 2016, a data bus 2017, and an antenna (antenna coil) 218 (FIG. 20A).

The power source circuit 2011 serves to generate power sources supplied for respective circuits in a semiconductor device based on AC signals inputted from the antenna 2018. The clock generating circuit 2012 serves to generate clock signals supplied for respective circuits in a semiconductor device based on AC signals inputted from the antenna 2018. The data demodulation/modulation circuit 2013 serves to demodulate and modulate data for communicating with a reader/writer 2019. The control circuit 2014 serves to control the memory 2016. The antenna 2018 serves to transmit and receive radio waves. The reader/writer 2019 controls a semiconductor device, communication with the semiconductor device, and processing of data thereof. Note that the RFID tag is not limited to this constitution and another element such as a limiter circuit of power source voltage and hardware dedicated to cryptanalysis may be additionally provided, for example.

In addition, the RFID tag may be a type in which power source voltage is supplied to each circuit by radio waves without mounting a power source (a battery), a type in which power source voltage is supplied to each circuit by a power source (a battery) mounted instead of an antenna, or a type in which power source voltage is supplied by radio waves and a power source.

In the case of using a semiconductor device according to the invention to an RFID tag or the like, it is advantageous in that non-contact communication is possible, multiple reading is possible, data writing is possible, transformation into various shapes is possible, directivity is wide and a wide recognition range is provided depending on the selected frequency, or the like. An RFID tag can be applied to an IC tag which can identify individual information of a person or an object by non-contact radio communication, an adhesive label which can be attached to an object by label processing, a wristband for an event or amusement, or the like. In addition, an RFID tag may be processed with a resin material or may be directly fixed to a metal obstructing wireless radio communication. Further, an RFID can be utilized for an operation of a system such as an entrance management system and a checkout system, or an adjustment system.

Next, one mode of the practical use of the RFID tag using a semiconductor device according to the invention will be explained below. A reader/writer 2030 is provided on a side of a portable terminal including a display portion 2031, and an RFID tag 2033 is provided on a side of merchandise 2032 (FIG. 20B). When the reader/writer 2030 is held up against the RFID tag 2033 of the merchandise 2032, information relating to merchandise, such as a raw material and a place of origin of the merchandise, a test result per production process, a record of distribution process, and further description of the merchandise is displayed in the display portion 2031. In addition, merchandise 2036 can be inspected by using a reader/writer 2034 and an RFID tag 2035 provided in the merchandise 2036, when the merchandise 2036 is transported by a belt conveyor (FIG. 20C). In this manner, information can be easily obtained, and a high function and a high added value are realized by utilizing an RFID tag for a system.

This embodiment mode can be implemented by arbitrarily combining with the above embodiment modes.

Embodiment Mode 11

Figure 21:
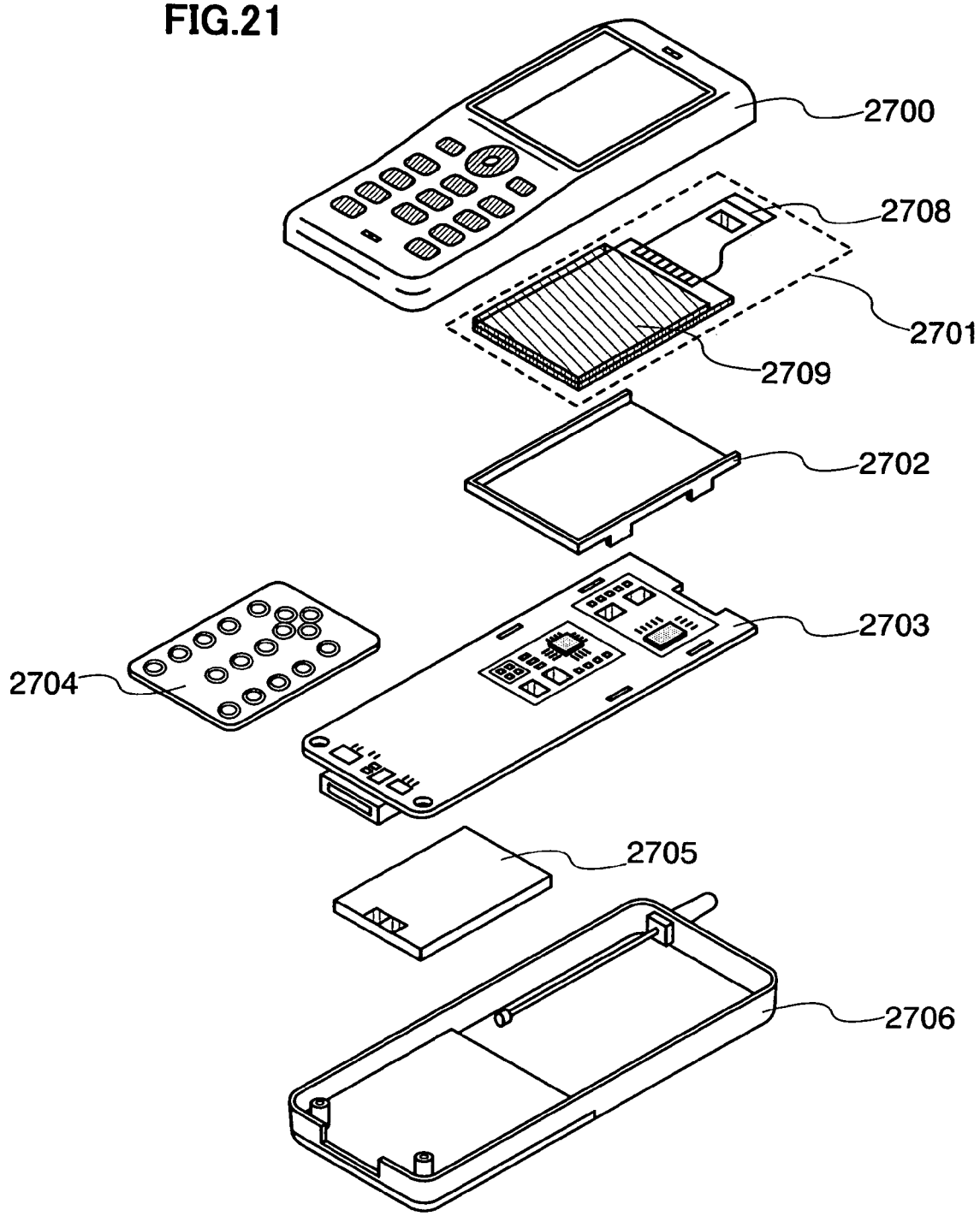
FIG. 21 is a view explaining a usage pattern of a semiconductor device according to the present invention (Embodiment Mode 11)

A semiconductor device according to the present invention can be applied in a wide field. For example, the present invention can be applied to an electronic device. The electronic device includes a television receiver, a computer, a portable information terminal such as a cellular phone, a camera such as a digital camera or a video camera, a navigation system, or the like. A case where a semiconductor device according to the present invention is applied to the cellular phone is explained with reference to FIG. 21.

The cellular phone includes housings 2700 and 2706, a panel 2701, a housing 2702, a printed wiring board 2703, operating buttons 2704, and a battery 2705. The housing 2702 incorporating the panel 2701 so as to be detachable is set to the printed wiring board 2703. The form and size of the housing 2702 are appropriately changed in accordance with an electronic device incorporating the panel 2701. A plurality of packaged semiconductor devices is mounted onto the printed wiring board 2703, and a semiconductor device according to the present invention can be used as one of the semiconductor devices. Each of the plurality of semiconductor devices mounted onto the printed wiring board 2703 has any one of function of a controller, a central processing unit (CPU), a memory, a power source circuit, an audio processing circuit, a transmitting/receiving circuit, and the like.

The panel 2701 is connected to the printed wiring board 2703 via a connecting film 2708. The panel 2701, the housing 2702, and the printed wiring board 2703 described above are contained inside the housings 2700 and 2706 together with the operating buttons 2704 and the battery 2705. A pixel region 2709 included in the panel 2701 is disposed so as to be seen from a window provided in the housing 2700.

A semiconductor device according to the present invention is compact, thin, and lightweight. Accordingly, the semiconductor device can utilize limited space inside the housings 2700 and 2706 of the electronic device effectively.

Moreover, a semiconductor device according to the present invention can be used as an RFID tag, for example, in paper money, coins, valuable securities, certificates, bearer bonds, packing containers, books, recording media, personal items, vehicles, food items, clothes, healthcare items, living wares, medicals, electronic devices, or the like. Specific examples thereof will be explained with reference to FIGS. 22A to 22H.

Figure 22A:
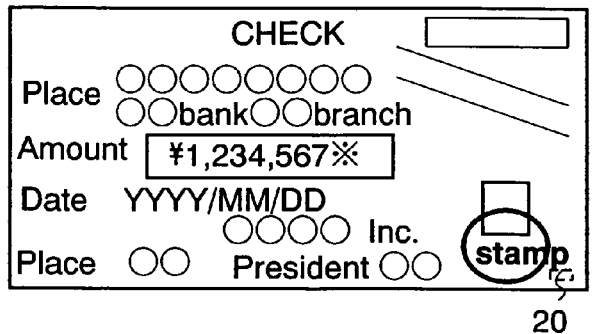
FIGS. 22A to 22H are views each explaining a usage pattern of a semiconductor device according to the present invention (Embodiment Mode 11)
Figure 22B:
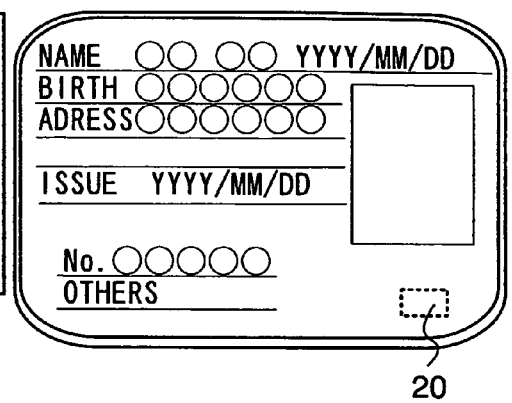
Figure 22C:
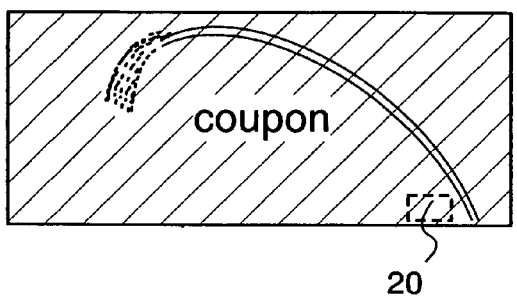
Figure 22D:
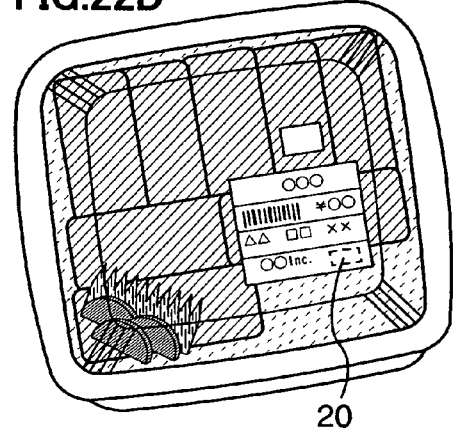
Figure 22E:
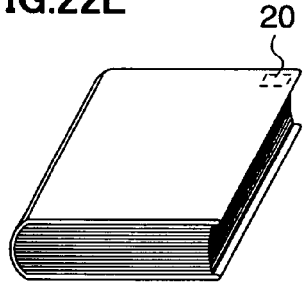
Figure 22F:
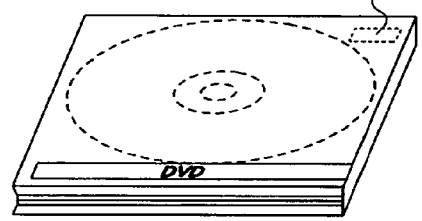
Figure 22G:
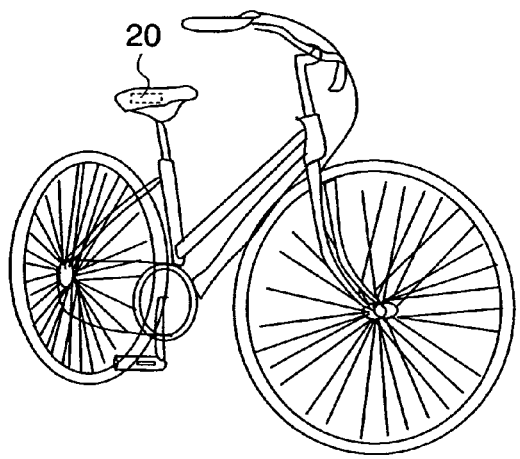
Figure 22H:
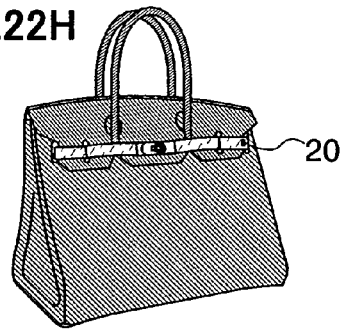

The paper money and the coins mean currency in the market, which include a note (a cash voucher) that is a currency in a specific area, memorial coins and the like. The valuable securities mean a check, a stock certificate, a promissory note, and the like (FIG. 22A). The certificates mean a driver's license, a resident card and the like (FIG. 22B). The bearer bonds mean a stamp, a rice coupon, various gift coupons and the like (FIG. 22C). The packing containers mean a wrapping paper for a lunch box or the like, a plastic bottle and the like (FIG. 22D). The books mean a book, a volume and the like (FIG. 22E). The recording media mean DVD software, a video tape and the like (FIG. 22F). The vehicles mean a wheeled vehicle such as a bicycle, a vessel, and the like (FIG. 22G). The personal items mean a bag, glasses, and the like (FIG. 22H). The food items mean groceries, beverages, and the like. The clothes mean wear, footwear, and the like. The healthcare items mean a medical instrument, a health appliance, and the like. The living wares mean furniture, a lighting apparatus, and the like. The medicals mean a medicine, an agrichemical, and the like. The electronic apparatuses mean a liquid crystal display device, an EL display device, a television apparatus (a television receiver and a thin television receiver), a cellular phone, and the like.

By providing an RFID tag for paper money, coins, valuable securities, certificates, bearer bonds, and the like, counterfeiting thereof can be prevented. In addition, by providing an RFID tag for packing containers, books, recording media, personal items, food items, living wares, electronic devices, and the like, the efficiency of the inspection system, the rental system, or the like can be improved. By providing an RFID tag for vehicles, healthcare items, medicals, and the like, counterfeiting and theft thereof can be prevented and the medicines can be prevented from being taken by mistake. The RFID tag may be attached to a surface of an object or embedded in an object. For example, the RFID tag may be embedded in paper of a book, or embedded in an organic resin of a package.

In this manner, by providing an RFID tag for packing containers, recording media, personal items, food items, clothes, living wares, electronic devices, or the like, efficiency of the inspection system, the rental system, or the like can be improved. By providing an RFID tag for vehicles, counterfeiting or theft thereof can be prevented. In addition, by embedding an RFID tag in a creature such as an animal, each creature can be easily identified, for example, by embedding an RFID in a creature such as a domestic animal, the first year of life, sex, breed, or the like thereof can be easily identified.

As described above, a semiconductor device according to the present invention can be used by being provided to any article. This embodiment mode can be implemented by arbitrarily combining with the above embodiment modes.

The present application is based on Japanese Patent Application serial No. 2005-133672 filed on Apr. 28, 2005 in Japanese Patent Office, the entire contents of which are hereby incorporated by reference.

What is claimed is:

1. A method for manufacturing a semiconductor device comprising:

forming a metal film over a substrate;

performing plasma treatment to the metal film in an atmosphere containing oxygen to form a metal oxide film on a surface of the metal film;

forming a base film over the metal oxide film;

forming an element layer comprising a thin film transistor over the base film;

forming a protective layer over the element layer;

selectively removing the metal film, the metal oxide film, the base film, the element layer, and the protective layer to form an opening;

separating the base film, the element layer, and the protective layer from the substrate; and sealing the base film, the element layer, and the protective layer by using flexible first and second films, wherein an electron density of the plasma treatment is $1\times10^{11}$ cm$^{-3}$ or more and $1\times10^{13}$ cm$^{-3}$ or less and an electron temperature of the plasma treatment is 0.5 eV or more and 1.5 eV or less around the substrate.

2. A method for manufacturing a semiconductor device comprising:

forming a metal oxide film over a substrate by using plasma in an atmosphere containing oxygen;

forming a base film over the metal oxide film;

forming an element layer comprising a thin film transistor over the base film;

forming a protective layer over the element layer;

selectively removing the metal oxide film, the base film, the element layer, and the protective layer to form an opening;

separating the base film, the element layer, and the protective layer from the substrate; and sealing the base film, the element layer, and the protective layer by using flexible first and second films, wherein an electron density of the plasma is $1\times10^{11}$ cm$^{-3}$ or more and $1\times10^{13}$ cm$^{-3}$ or less and an electron temperature of the plasma is 0.5 eV or more and 1.5 eV or less around the substrate.

3. A method for manufacturing a semiconductor device comprising:

forming an insulating film over a substrate;

forming a metal film over the insulating film;

performing first plasma treatment to the metal film in an atmosphere containing oxygen to form a metal oxide film on a surface of the metal film;

forming a silicon oxide film over the metal oxide film;

performing second plasma treatment to the silicon oxide film in an atmosphere containing nitrogen to nitride the surface of the silicon oxide film;

forming a silicon oxide film containing nitrogen over the silicon oxide film, the surface of the silicon oxide film being nitrided;

forming an element layer comprising a thin film transistor over the silicon oxide film containing nitrogen;

forming a protective layer over the element layer;

removing the insulating film, the metal film, the metal oxide film, the silicon oxide film, the surface of the silicon oxide film being nitrided, the silicon oxide film containing nitrogen, the element layer, and the protective layer to form an opening;

separating the silicon oxide film, the surface of the silicon oxide film being nitrided, the silicon oxide film containing nitrogen, the element layer, and the protective layer from the substrate; and sealing the silicon oxide film, the surface of the silicon oxide film being nitrided, the silicon oxide film containing nitrogen, the element layer, and the protective layer by using flexible first and second films, wherein an electron density of the first plasma treatment is $1\times10^{11}$ cm$^{-3}$ or more and $1\times10^{13}$ cm$^{-3}$ or less and an electron temperature of the first plasma treatment is 0.5 eV or more and 1.5 eV or less around the substrate.

4. A method for manufacturing a semiconductor device comprising:

forming an insulating film over a substrate;

forming a metal oxide film over the insulating film by using plasma in an atmosphere containing oxygen;

forming a silicon oxide film over the metal oxide film;

performing plasma treatment to the silicon oxide film in an atmosphere containing nitrogen to nitride the surface of the silicon oxide film;

forming a silicon oxide film containing nitrogen over the silicon oxide film, the surface of the silicon oxide film being nitrided;

forming an element layer comprising a thin film transistor over the silicon oxide film containing nitrogen;

forming a protective layer over the element layer;

selectively removing the insulating film, the metal oxide film, the silicon oxide film, the surface of the silicon oxide film being nitrided, the silicon oxide film containing nitrogen, the element layer, and the protective layer to form an opening;

separating the silicon oxide film, the surface of the silicon oxide film being nitrided, the silicon oxide film containing nitrogen, the element layer, and the protective layer from the substrate; and sealing the silicon oxide film, the surface of the silicon oxide film being nitrided, the silicon oxide film containing nitrogen, the element layer, and the protective layer by using flexible first and second films, wherein an electron density of the plasma is $1\times10^{11}$ cm$^{-3}$ or more and $1\times10^{13}$ cm$^{-3}$ or less and an electron temperature of the plasma is 0.5 eV or more and 1.5 eV or less around the substrate.

5. A method for manufacturing a semiconductor device according to claim 3, wherein the atmosphere containing nitrogen is a mixed gas of $N_2$ or $NH_3$ and a rare gas, or a mixed gas of $N_2$ or $NH_3$, a rare gas, and $H_2$.

6. A method for manufacturing a semiconductor device according to claim 4, wherein the atmosphere containing nitrogen is a mixed gas of $N_2$ or $NH_3$ and a rare gas, or a mixed gas of $N_2$ or $NH_3$, a rare gas, and $H_2$.

7. A method for manufacturing a semiconductor device according to claim 1, wherein the atmosphere containing oxygen is a mixed gas of $O_2$ or $N_2O$ and a rare gas, or a mixed gas of $O_2$ or $N_2O$, a rare gas, and $H_2$.

8. A method for manufacturing a semiconductor device according to claim 2, wherein the atmosphere containing oxygen is a mixed gas of $O_2$ or $N_2O$ and a rare gas, or a mixed gas of $O_2$ or $N_2O$, a rare gas, and $H_2$.

9. A method for manufacturing a semiconductor device according to claim 3, wherein the atmosphere containing oxygen is a mixed gas of $O_2$ or $N_2O$ and a rare gas, or a mixed gas of $O_2$ or $N_2O$, a rare gas, and $H_2$.

10. A method for manufacturing a semiconductor device according to claim 4, wherein the atmosphere containing oxygen is a mixed gas of $O_2$ or $N_2O$ and a rare gas, or a mixed gas of $O_2$ or $N_2O$, a rare gas, and $H_2$.

11. A method for manufacturing a semiconductor device according to claim 1, wherein a frequency of a power source for the plasma treatment is 2.45 GHz.

12. A method for manufacturing a semiconductor device according to claim 2, wherein a frequency of a power source for generating the plasma is 2.45 GHz.

13. A method for manufacturing a semiconductor device according to claim 3, wherein a frequency of a power source for generating the first and second plasma is 2.45 GHz.

14. A method for manufacturing a semiconductor device according to claim 4, wherein a frequency of a power source for generating the plasma and the plasma treatment is 2.45 GHz.

15. A method for manufacturing a semiconductor device according to claim 1, wherein potential of the plasma is 5V or less.

16. A method for manufacturing a semiconductor device according to claim 2, wherein potential of the plasma is 5V or less.

17. A method for manufacturing a semiconductor device according to claim 3, wherein potential of the first plasma treatment is 5V or less.

18. A method for manufacturing a semiconductor device according to claim 3, wherein potential of the second plasma treatment is 5V or less.

19. A method for manufacturing a semiconductor device according to claim 4, wherein potential of the plasma is 5V or less.

20. A method for manufacturing a semiconductor device according to claim 4, wherein potential of the plasma treatment is 5V or less.

21. A method for manufacturing a semiconductor device according to claim 3,
wherein an electron density of the second plasma treatment is $1\times10^{11}$ cm$^{-3}$ or more and $1\times10^{13}$ cm$^{-3}$ or less and an electron temperature of the first plasma treatment is 0.5 eV or more and 1.5 eV or less around the substrate.

22. A method for manufacturing a semiconductor device according to claim 4,
wherein an electron density of the plasma treatment is $1\times10^{11}$ cm$^{-3}$ or more and $1\times10^{13}$ cm$^{-3}$ or less and an electron temperature of the plasma treatment is 0.5 eV or more and 1.5 eV or less around the substrate.

* * * * *